United States Patent
Sakoh et al.

(10) Patent No.: US 8,043,883 B2
(45) Date of Patent: Oct. 25, 2011

(54) METHOD FOR MANUFACTURING SOLID-STATE IMAGING DEVICE HAVING IMPROVED SENSITIVITY AND REDUCED FLARE

(75) Inventors: Hiroshi Sakoh, Kyoto (JP); Yoshiaki Nishi, Kyoto (JP); Yasuo Takeuchi, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/109,653

(22) Filed: May 17, 2011

(65) Prior Publication Data
US 2011/0217808 A1 Sep. 8, 2011

Related U.S. Application Data

(62) Division of application No. 12/169,056, filed on Jul. 8, 2008, now Pat. No. 7,973,378.

(30) Foreign Application Priority Data

Jul. 11, 2007 (JP) ................................ 2007-182696

(51) Int. Cl.
*H01L 21/00* (2006.01)
(52) U.S. Cl. ................. 438/72; 438/48; 438/65; 438/70
(58) Field of Classification Search ............. 438/48–52, 438/65, 72; 257/432–437, 89, E27.134; 348/311–314, 143–148
See application file for complete search history.

(56) References Cited

U.S. PATENT DOCUMENTS

| 6,833,601 B2 | 12/2004 | Murakami |
| 2007/0030380 A1* | 2/2007 | Higuchi et al. ............... 348/340 |
| 2007/0117349 A1* | 5/2007 | Komatsu et al. ............... 438/459 |
| 2008/0018770 A1 | 1/2008 | Kato |
| 2008/0074527 A1 | 3/2008 | Kato |
| 2008/0143829 A1 | 6/2008 | Takeda |
| 2008/0158359 A1 | 7/2008 | Takeda |
| 2008/0170143 A1 | 7/2008 | Yoshida |

FOREIGN PATENT DOCUMENTS

| JP | 4-34977 | 2/1992 |
| JP | 2910161 | 4/1999 |
| JP | 2003-234456 | 8/2003 |

* cited by examiner

*Primary Examiner* — Dung A. Le
(74) *Attorney, Agent, or Firm* — Greenblum & Bernstein, P.L.C.

(57) ABSTRACT

Provided is a solid-state imaging device that realizes sensitivity improvement while maintaining flare prevention effect even when miniaturization of cell is advanced. The solid-state imaging device according to the present invention includes: light receiving units formed on a semiconductor substrate; an antireflection film arranged above the semiconductor substrate, except above the light receiving units; and microlenses arranged above the light receiving units, in which the antireflection film is formed at a position equal to or higher than a position of the microlenses.

7 Claims, 34 Drawing Sheets

(a)  (b)

(c)

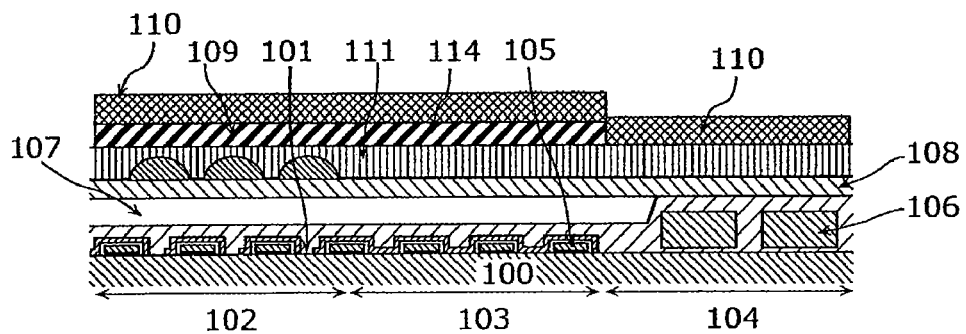
FIG. 11F
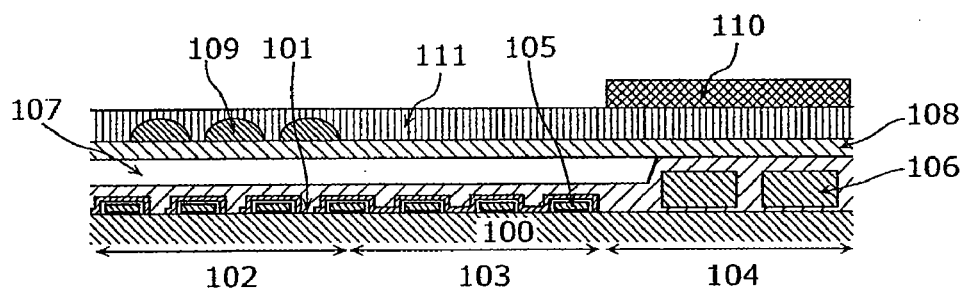
FIG. 11G
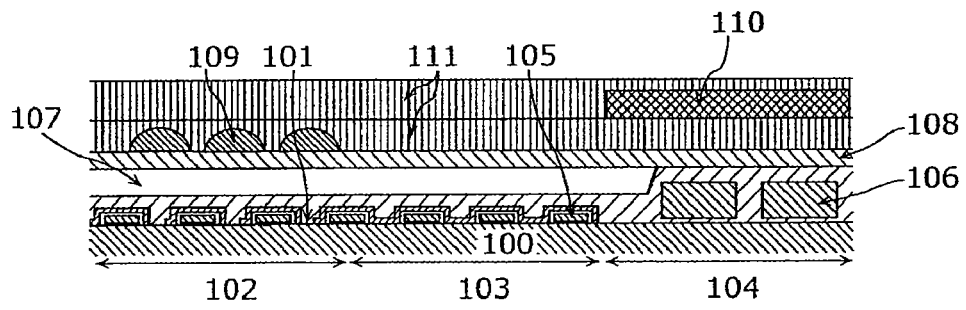

METHOD FOR MANUFACTURING SOLID-STATE IMAGING DEVICE HAVING IMPROVED SENSITIVITY AND REDUCED FLARE

CROSS-REFERENCE TO RELATED APPLICATIONS

This application is a divisional application of U.S. patent application Ser. No. 12/169,056, filed on Jul. 8, 2008, which claims priority to Japanese Application No. 2007-182696, filed Jul. 11, 2007, the contents of which are hereby incorporated by reference in their entirety.

BACKGROUND OF THE INVENTION (1) Field of the Invention

The present invention relates to a solid-state imaging device and a method for manufacturing the solid-state imaging device for sensitivity improvement and flare reduction.

(2) Description of the Related Art

In recent years, coupled with miniaturization of chip size and increase in the number of pixels in a solid-state imaging device, miniaturization and sophistication of a movie camera and the like have been advanced.

A conventional solid-state imaging device disclosed in Japanese Unexamined Patent Application Laid-Open Publication No. 4-34977 (Patent Reference 1) will be described with reference to the drawings.

As shown in FIG. 1, an effective pixel region 102, an optical black (OB) region 103, and a peripheral region 104 are formed on a semiconductor substrate 100 by diffusion processes. After a planarizing film is applied, a resist containing a black pigment for improving a flare property (an antireflection film 110) is formed above the peripheral region 104 excluding at least the effective pixel region 102 and the OB region 103. Further, a transparent film (intermediate film) 108 under microlens is formed which is designed to have a desirable film thickness for planarizing a step created by the formation of the antireflection film 110 and maximizing a light collection effect. Microlenses 109 are formed thereon.

In other words, the antireflection film 110 having black color and the like is arranged to reduce flare occurring when high-luminance light enters the peripheral region 104. Transmittance of the antireflection film 110 is preferably equal to or less than 20% for flare reduction, and thus above a certain thickness is required for this reason. In addition, the microlenses 109 are formed to improve sensitivity of the solid-state imaging device.

However, as miniaturization of cell in a solid-state imaging device is advanced by downsizing a camera, in the conventional solid-state imaging device shown in FIG. 1, it is difficult to shorten a distance from light receiving units to microlenses, and light collection optimization is limited (the first problem).

The reason for such a problem will be described using FIG. 2.

FIG. 2(a) shows a cross-sectional structure of an effective pixel region of a large cell, and FIG. 2(b) shows a cross-sectional structure of an effective pixel region in the case where an intermediate film under miniaturized microlens cannot be thinned. As shown in FIG. 2(a), one of the microlenses 109 allows light to focus on one of light receiving units 101 in the pixel region having a large cell with relative ease. In contrast, as shown in FIG. 2(b), when being miniaturized, the microlens 109 does not allow light to focus on the light receiving unit 101 (a focus is above the light receiving unit 101), which makes the light collection optimization difficult. In particular, as a light collection property for oblique light component is worsened, sensitivity deterioration at a side where aperture is opened becomes remarkable as a camera (the second problem).

Moreover, although it is necessary to increase pigment concentration to perform film thinning on a resist containing a black pigment while maintaining transmittance characteristics, the current technique does not allow significant film thinning easily, and it is not easy to perform the film thinning while maintaining a flare prevention effect (the third problem).

Furthermore, although, as another proposal, it is conceivable that, in order to shorten a distance from the light receiving unit 101 to the microlens 109, at least the antireflection film 110 is arranged in the peripheral region 104 excluding the effective pixel region 102 and the OB region 103 after the microlens 109 is formed in advance, a problem arises that the antireflection film 110 cannot be formed on a surface of the solid-state imaging device as the antireflection film 110 has weak solvent resistance (the fourth problem).

An object of the present invention is to provide a solid-state imaging device that realizes the sensitivity improvement while maintaining the flare prevention effect even when the miniaturization of cell is advanced.

SUMMARY OF THE INVENTION

In order to solve the above-mentioned problems, the solid-state imaging device according to the present invention includes: light receiving units formed on a semiconductor substrate; an antireflection film arranged above the semiconductor substrate, except above the light receiving units; and microlenses arranged above the light receiving units, wherein the antireflection film is formed at a position equal to or higher than a position of the microlenses.

With this structure, the antireflection film is formed at the position equal to or higher than the position of the microlenses, thereby preventing the existence of the antireflection from impeding light collection optimization of the microlenses. Accordingly, even when miniaturization of cell is advanced, it is possible to improve sensitivity. In addition, since film thickness of the antireflection film does not affect the light collection optimization, it is not necessary to thin the antireflection film according to the miniaturization of cell, and it is possible to maintain flare prevention effect.

Here, the antireflection film may be formed in a same layer as a layer of the microlenses.

Here, the antireflection film may be formed in a layer higher than a layer of the microlenses.

The solid-state imaging device may further include a transparent film having a refractive index lower than a refractive index of the microlenses, the transparent film being on the microlenses, wherein the antireflection film may be formed in a peripheral region of an imaging region including the light receiving units.

The solid-state imaging device may further include a transparent film having a refractive index lower than the refractive index of the microlenses, the transparent film being on the microlenses and the antireflection film.

With these structures, the transparent film having the refractive index lower than the refractive index of the microlenses allows a sensitivity property of the light receiving units to be maintained without reducing light collection effect of the microlenses.

The solid-state imaging device may further include: the first transparent film having a refractive index lower than a refractive index of the microlenses, the first transparent film being on the microlenses and a peripheral region; and the second transparent film having a refractive index lower than the refractive index of the microlenses, the second transparent film being on the first transparent film, wherein the antireflection film may be formed on the first transparent film in the peripheral region, and the second transparent film may be formed on the first transparent film and the antireflection film.

With this structure, since the antireflection film can be formed by dry-etching, it is possible to easily improve processing accuracy.

The solid-state imaging device may further include a planarizing film formed on the light receiving units; and an intermediate transparent film formed on the planarizing film, wherein the microlenses may be formed on the intermediate transparent film, and the antireflection film may be formed on the intermediate transparent film or in a layer higher than a layer of the intermediate transparent film.

With this structure, it is possible to freely design film thickness of the intermediate transparent film under microlens without being influenced by the antireflection film. Adjusting the film thickness of the intermediate transparent film readily facilitates the light collection optimization of the microlenses.

Moreover, a camera according to the present invention has the same structures and advantageous effects as the above-mentioned solid-state imaging device.

Furthermore, a method for manufacturing a solid-state imaging device according to the present invention includes: forming light receiving units on a semiconductor substrate; forming microlenses above the light receiving units; and forming an antireflection film above the semiconductor substrate, except above the light receiving units, so as to reduce light reflection, wherein, in the forming of the antireflection film, the antireflection film is formed at a position equal to or higher than a position of the microlenses.

In the forming of the antireflection film, the antireflection film may be formed by at least one of a lithography process, a dry etching process, and a process including deposition and lift-off.

The solid-state imaging device according to the present invention allows the flare property to be maintained and, even when the miniaturization of cell is advanced, the film thickness of the transparent film (intermediate film) under microlens capable of the light collection optimization to be set without being limited by the film thickness of the antireflection film.

The camera according to the present invention has the solid-state imaging device having such advantageous effects, and can improve the sensitivity while reducing flare.

FURTHER INFORMATION ABOUT TECHNICAL BACKGROUND TO THIS APPLICATION

The disclosure of Japanese Patent Application No. 2007-182696 filed on Jul. 11, 2007 including specification, drawings and claims is incorporated herein by reference in its entirety.

BRIEF DESCRIPTION OF DRAWINGS

These and other objects, advantages and features of the invention will become apparent from the following description thereof taken in conjunction with the accompanying drawings that illustrate a specific embodiment of the invention. In the accompanying drawings:

FIG. 11E shows the third method for manufacturing the solid-state imaging device according to the second embodiment;

FIG. 11F shows the third method for manufacturing the solid-state imaging device according to the second embodiment;

FIG. 11G shows the third method for manufacturing the solid-state imaging device according to the second embodiment;

DESCRIPTION OF THE PREFERRED EMBODIMENT(S)

First Embodiment

The following describes a solid-state imaging device and a method for manufacturing the solid-state imaging device according to a first embodiment of the present invention with reference to the drawings.

Figure 3:
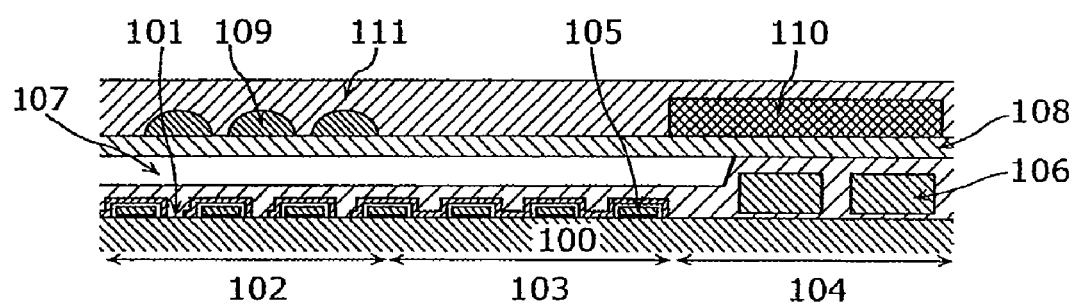
FIG. 3 shows a cross-sectional structure of a solid-state imaging device according to a first embodiment.

FIG. 3 shows a structural cross-section view of the solid-state imaging device according to the first embodiment of the present invention.

As shown in FIG. 3, an effective pixel region 102, an optical black (OB) region 103, and further a peripheral region 104 of the OB region 103 are formed on a semiconductor substrate 100 by diffusion processes. Subsequently, a planarizing film 107 is applied. Here, the effective pixel region 102 is a region where signal charges are generated by light entering the solid-state imaging device (light receiving units) from the above. Furthermore, the OB region 103 is a group of pixels to be standard (black standard) when outputting image data.

In addition, as shown in FIG. 3, a transparent film (intermediate film) 108 under microlens which is designed to have a desirable thickness (film thickness which allows light entering microlenses to focus on the light receiving units) for light collection optimization according to a cell size is arranged in the effective pixel region 102, and microlenses 109 are formed on the transparent film (intermediate film) 108 under microlens. Furthermore, an antireflection film 110 is arranged on the transparent film (intermediate film) 108 under microlens in the peripheral region 104 excluding the effective pixel region 102 and the OB region 103, and a transparent film 111 having a refractive index lower than that of the microlenses 109 is formed on the microlenses 109 to be in the same layer as the antireflection film 110.

Here, flare is a phenomenon which reduces image contrast by reflection of high-luminance light occurring between a surface of image sensor chip and face glass, the face glass and a camera lens, and in the camera lens at a time when the high-luminance light enters the solid-state imaging device. The flare refers to property degradation which causes an image to be partially washed out.

Moreover, when the high-luminance light enters the solid-state imaging device, it is necessary to form the antireflection film 110 which is provided to ameliorate a flare property in an area where reflection of the light on a chip surface tends to affect image quality, and at least it is necessary to form the antireflection film 110 on the peripheral region 104 excluding the effective pixel region 102 and the OB region 103. The antireflection film 110 is also referred to as an antireflection filter, a light absorption filter, or a black-color filter.

It is to be noted that, in the case where a material of the OB region 103 is highly reflective or a highly reflective material (e.g., aluminum) is formed above the OB region 103, it is necessary to form an antireflection film thereon.

Furthermore, the reason for forming, on the microlenses 109, the transparent film 111 having a refractive index lower than that of the microlenses 109 is that, as the antireflection film 110 which is formed in the same layer as the microlenses 109 has low solvent resistance, it is necessary to form a film having higher solvent resistance on the antireflection film 110, and, in such case, it is necessary to form a film having higher solvent resistance also on the microlenses 109. However, in the case where a film having a refractive index equal to or higher than that of the microlenses 109 is formed, light collection effect of the microlenses 109 is reduced, and a sensitivity property of the solid-state imaging device is lowered.

Accordingly, for the reasons stated above, a transparent film having a refractive index lower than that of the microlenses 109 is formed so as to maintain the light collection effect of the microlenses 109.

Figure 1:
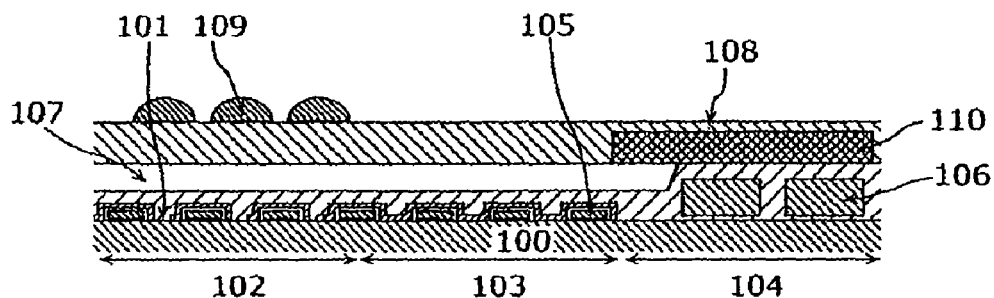
FIG. 1 shows a cross-sectional structure of a conventional solid-state imaging device.
Figure 2:
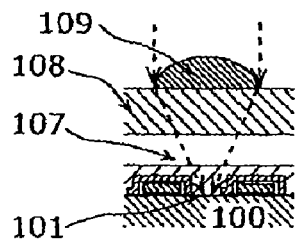
FIG. 2(a) shows a cross-sectional view of an effective pixel region of a large cell.
FIG. 2(b) shows a cross-sectional view of an effective pixel region in the case where an intermediate film under miniaturized microlens cannot be thinned.
FIG. 2(c) shows a cross-sectional view of an effective pixel region in the case where an intermediate film under miniaturized microlens can be thinned
Figure 2:
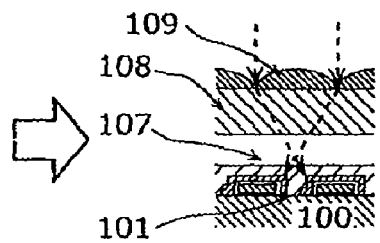
Figure 2:
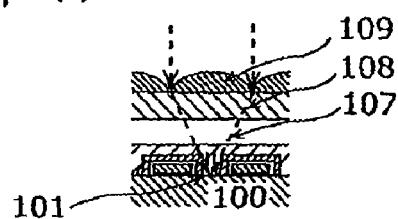

With this structure, the solid-state imaging device according to the first embodiment of the present invention allows film thickness of the transparent film (intermediate film) 108 under microlens to be set more freely and light entering the microlenses 109 to be easily focused on the light receiving units, so as to facilitate the light collection optimization as shown in FIG. 2(*c*).

In other words, the solid-state imaging device according to the first embodiment of the present invention allows the film thickness of the transparent film (intermediate film) 108 under microlens to be determined by forming the antireflection film 110 above the transparent film (intermediate film) 108 under microlens whose film thickness is not limited by film thickness of the antireflection film 110 even when a cell size is miniaturized; the light entering the microlenses 109 to be focused on the light receiving units for the light collection optimization; and the sensitivity deterioration at the side where the camera aperture is opened to be prevented.

Further, the solid-state imaging device according to the first embodiment of the present invention allows spectral sensitivity of the antireflection film 110 to be maintained by forming the antireflection film 110 above the transparent film (intermediate film) 108 under microlens and the distance from the light receiving units to the microlenses to be shortened while maintaining the flare prevention effect.

Additionally, the solid-state imaging device according to the first embodiment of the present invention allows the antireflection film 110 to be protected from exposure to solvent in a manufacturing process by forming, on the antireflection film 110, the transparent film 111 having solvent resistance and a refractive index lower than that of the microlenses, and thereby forming the antireflection film 110 on the surface of the solid-state imaging device.

Next, the first to the fourth methods for manufacturing the solid-state imaging device according to the first embodiment of the present invention will be described with reference to the drawings.

FIGS. 5A to 5H show the first method for manufacturing the solid-state imaging device according to the first embodiment.

In the first method for manufacturing, a single-layer antireflection film is formed through a lithography process (application, exposure, and development).

Figure 5A:
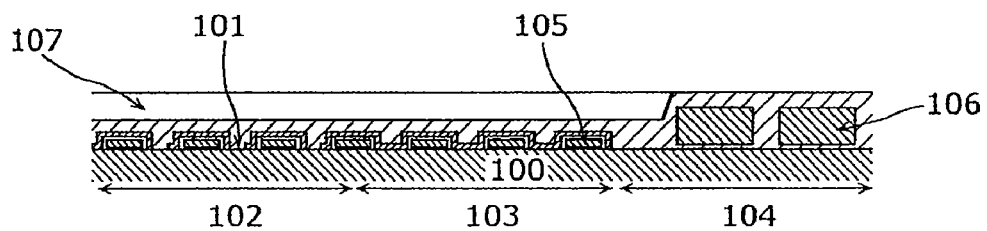
FIG. 5A shows the first method for manufacturing the solid-state imaging device according to the first embodiment.
Figure 5B:
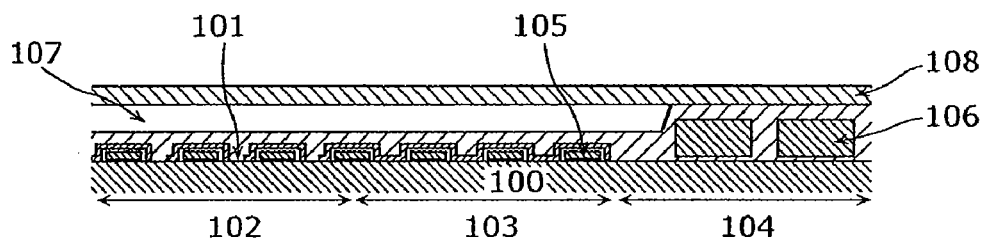
FIG. 5B shows the first method for manufacturing the solid-state imaging device according to the first embodiment.

First, after a planarizing film is applied as shown in FIG. 5A, the intermediate film 108 is applied to form a transparent film under to microlens as shown in FIG. 5B.

Figure 5C:
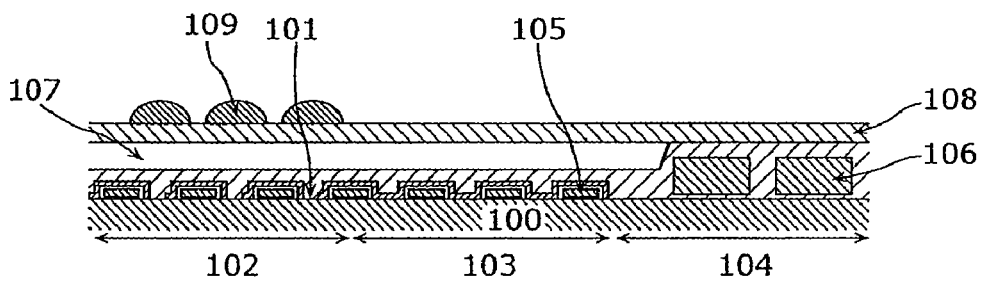
FIG. 5C shows the first method for manufacturing the solid-state imaging device according to the first embodiment.

Next, as shown in FIG. 5C, the microlenses 109 are formed with an existing method.

Figure 5D:
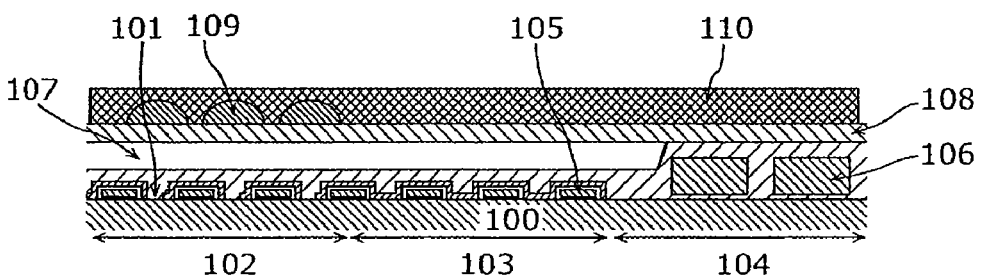
FIG. 5D shows the first method for manufacturing the solid-state imaging device according to the first embodiment.
Figure 5E:
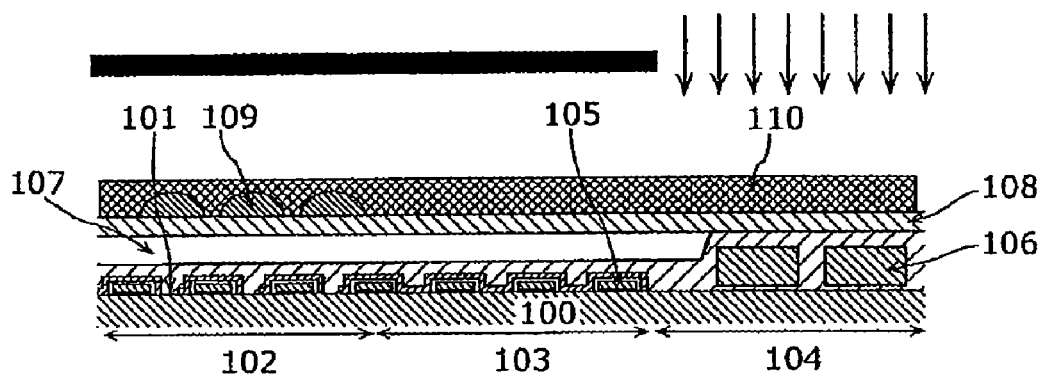
FIG. 5E shows the first method for manufacturing the solid-state imaging device according to the first embodiment.
Figure 5F:
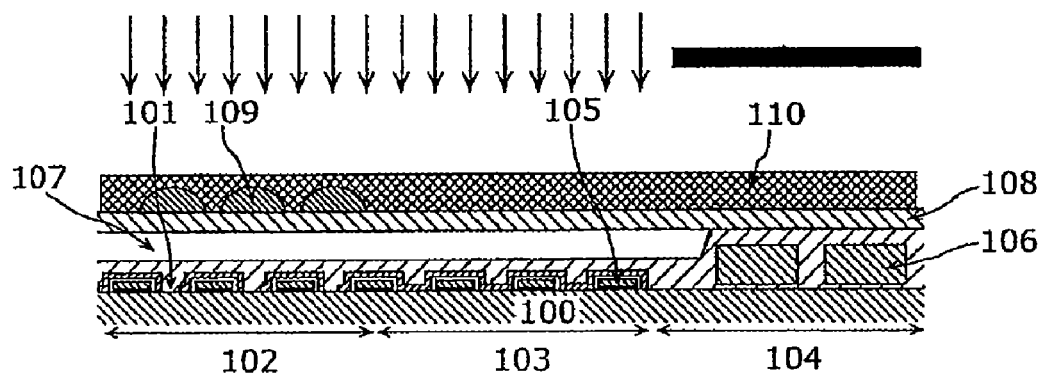
FIG. 5F shows the first method for manufacturing the solid-state imaging device according to the first embodiment.

Next, as shown in FIG. 5D, in the case of forming the antireflection film 110 in a single-layer and the same layer as the microlenses, a resist for forming the antireflection film 110 is applied and exposed. It is to be noted that, in the case of a negative resist, the resist is applied and exposed as shown in FIG. 5E, and in the case of a positive resist, the resist is applied and exposed as shown in FIG. 5F.

Figure 5G:
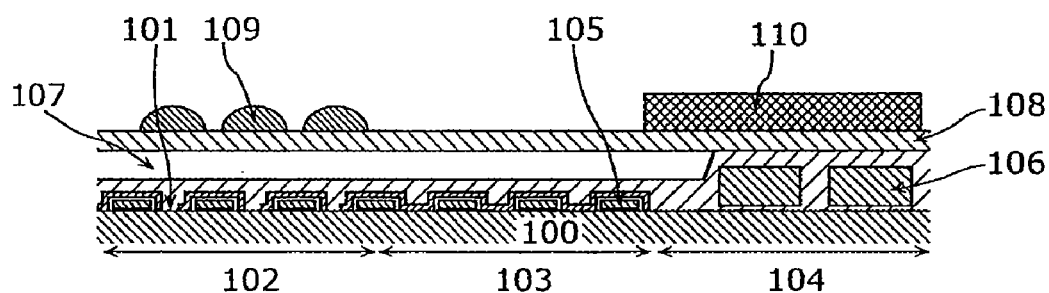
FIG. 5G shows the first method for manufacturing the solid-state imaging device according to the first embodiment.
Figure 5H:
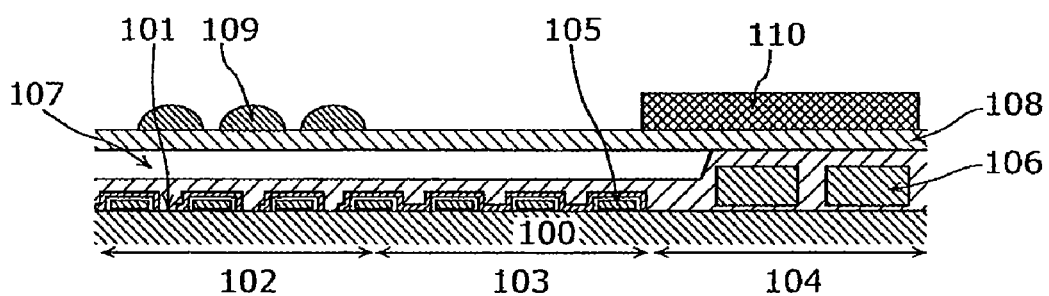
FIG. 5H shows the first method for manufacturing the solid-state imaging device according to the first embodiment.

Next, the antireflection film 110 is developed as shown in FIG. 5G (in the case of dyeing, the dyeing is performed as shown in FIG. 5H), and at least formed in a peripheral area excluding the effective pixel region 102 and the OB region 103.

FIGS. 6A to 6J show the second method for manufacturing the solid-state imaging device according to the first embodiment. In the second method for manufacturing, a two-layer antireflection film is formed through a lithography process (application, exposure, and development).

Compared with the first method for manufacturing, the second method for manufacturing differs in that processes of FIGS. 6A to 6J, instead of FIGS. 5D to 5H, are included. Description of the same points is omitted, and the following description mainly focuses on different points.

Figure 6A:
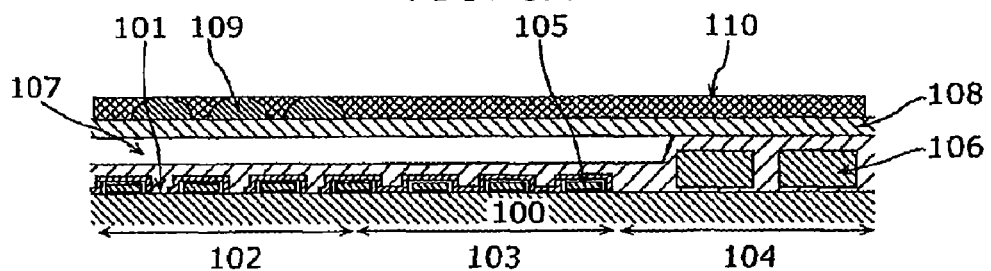
FIG. 6A shows the second method for manufacturing the solid-state imaging device according to the first embodiment.

After the microlenses 109 in FIG. 5C are formed, as shown in FIG. 6A, in the case of forming a resist for forming antireflection film by laminating (for example, a red layer and blue layer), the first layer resist is applied for 0.3 μm to 1.5 μm.

Figure 6B:
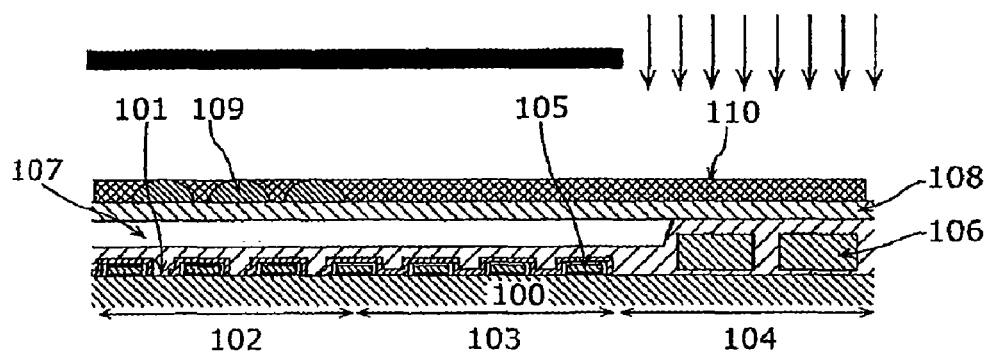
FIG. 6B shows the second method for manufacturing the solid-state imaging device according to the first embodiment.
Figure 6C:
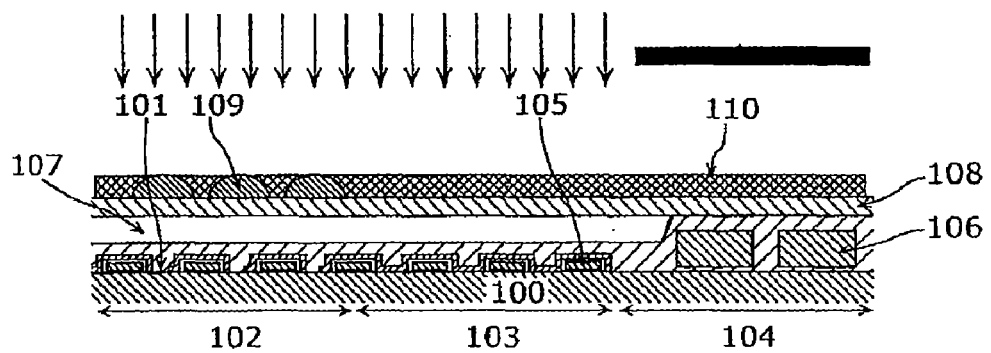
FIG. 6C shows the second method for manufacturing the solid-state imaging device according to the first embodiment.

It is to be noted that, in the case of a negative resist, the resist is exposed as shown in FIG. 6B, and in the case of a positive resist, the resist is exposed as shown in FIG. 6C.

Figure 6D:
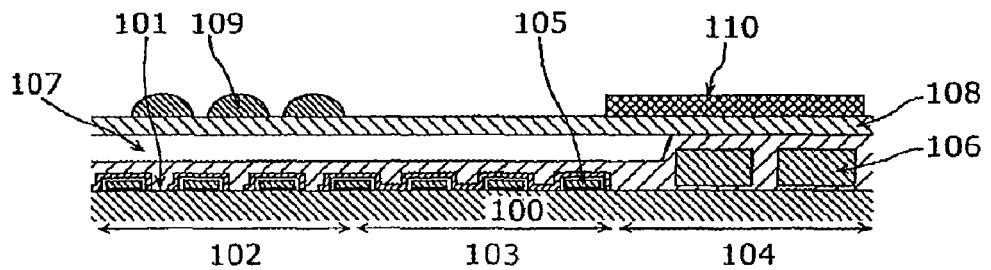
FIG. 6D shows the second method for manufacturing the solid-state imaging device according to the first embodiment.
Figure 6E:
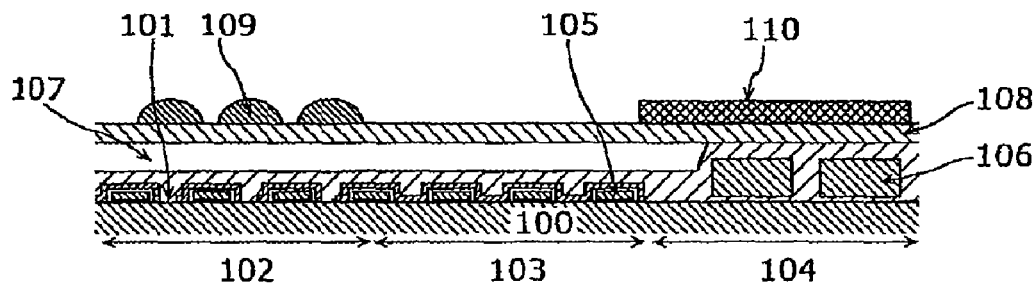
FIG. 6E shows the second method for manufacturing the solid-state imaging device according to the first embodiment.
Figure 6F:
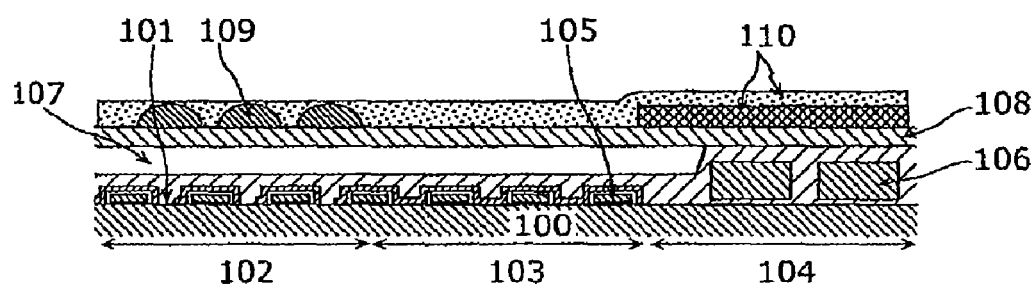
FIG. 6F shows the second method for manufacturing the solid-state imaging device according to the first embodiment.
Figure 6G:
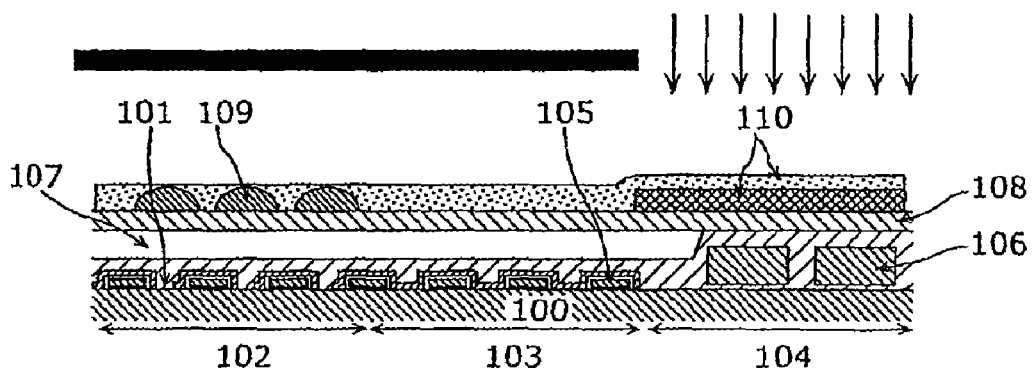
FIG. 6G shows the second method for manufacturing the solid-state imaging device according to the first embodiment.
Figure 6H:
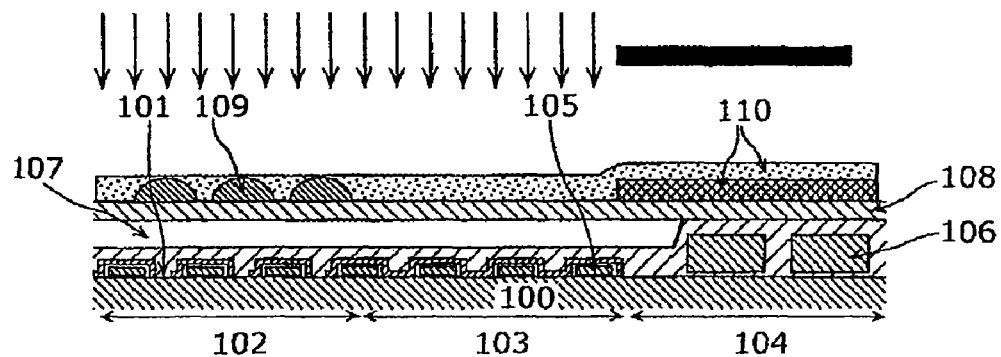
FIG. 6H shows the second method for manufacturing the solid-state imaging device according to the first embodiment.
Figure 6I:
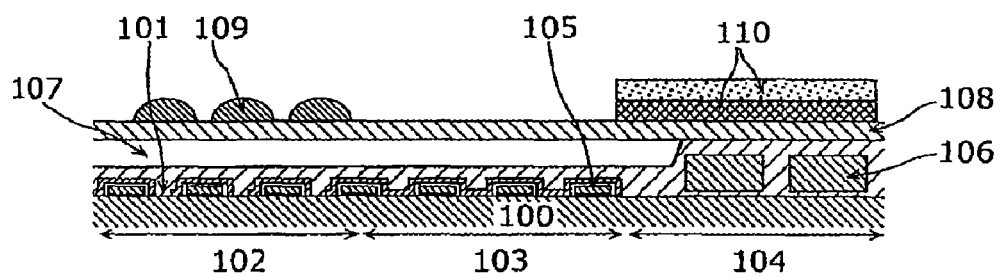
FIG. 6I shows the second method for manufacturing the solid-state imaging device according to the first embodiment.
Figure 6J:
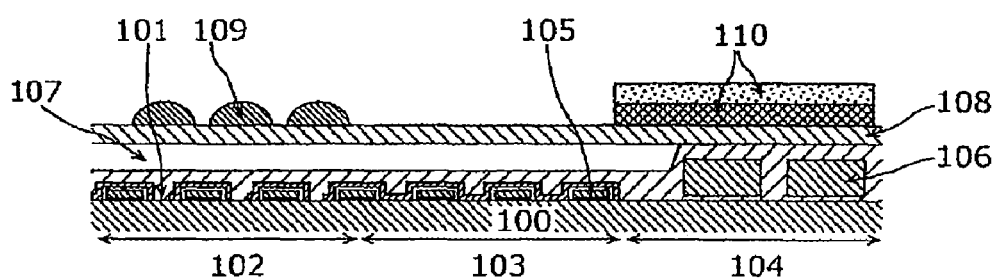
FIG. 6J shows the second method for manufacturing the solid-state imaging device according to the first embodiment.

Next, the antireflection film 110 is developed as shown in FIG. 6D (in the case of dyeing, the dyeing is performed as shown in FIG. 6E), and at least formed in a peripheral area excluding the effective pixel region 102 and the OB region 103. It is to be noted that, in the case of forming the resist for forming antireflection film by laminating (for example, a red layer and blue layer), as shown in FIGS. 6F to 6J, the second layer filter is formed in the same manner as the first color filter and laminated.

FIGS. 7A to 7G show the third method for manufacturing the solid-state imaging device according to the first embodiment. In the third method for manufacturing, a single-layer antireflection film is formed by deposition and a lift-off method.

Compared with the first method for manufacturing, the third method for manufacturing differs in that processes of FIGS. 7A to 7G, instead of FIGS. 5D to 5H, are included. Description of the same points is omitted, and the following description mainly focuses on different points.

Figure 7A:
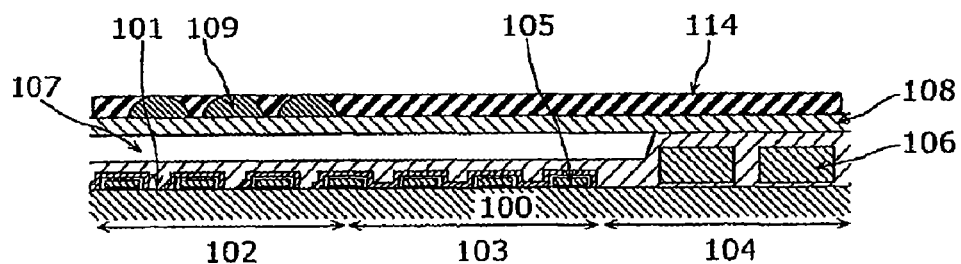
FIG. 7A shows the third method for manufacturing the solid-state imaging device according to the first embodiment.

After the microlenses 109 in FIG. 5C are formed, as shown in FIG. 7A, in the case of forming a single-layer antireflection film 110 by the deposition and in the same layer as the microlenses 109, a resist is applied.

Figure 7B:
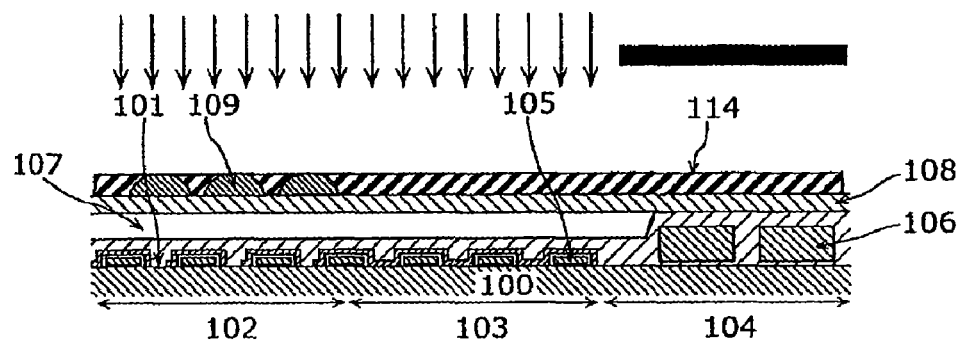
FIG. 7B shows the third method for manufacturing the solid-state imaging device according to the first embodiment.
Figure 7C:
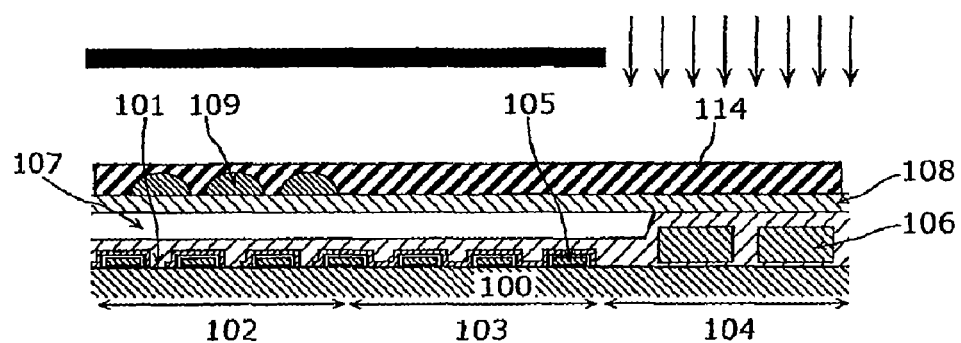
FIG. 7C shows the third method for manufacturing the solid-state imaging device according to the first embodiment.

Next, in the case of a negative resist, the resist is exposed as shown in FIG. 7B, and in the case of a positive resist, the resist is exposed as shown in FIG. 7C.

Figure 7D:
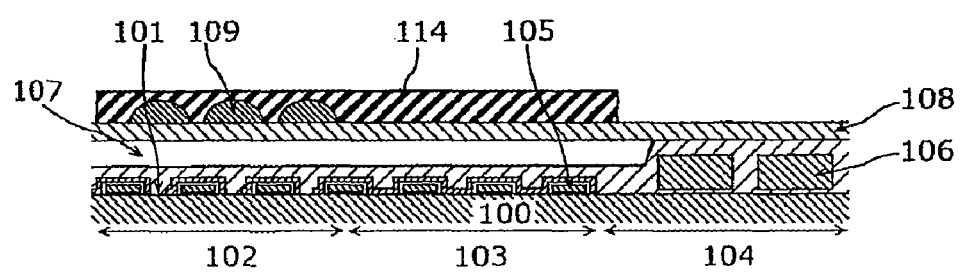
FIG. 7D shows the third method for manufacturing the solid-state imaging device according to the first embodiment.
Figure 7E:
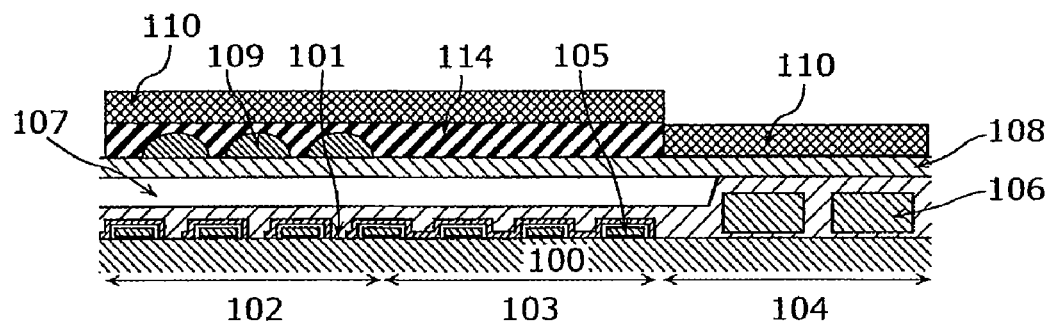
FIG. 7E shows the third method for manufacturing the solid-state imaging device according to the first embodiment.
Figure 7F:
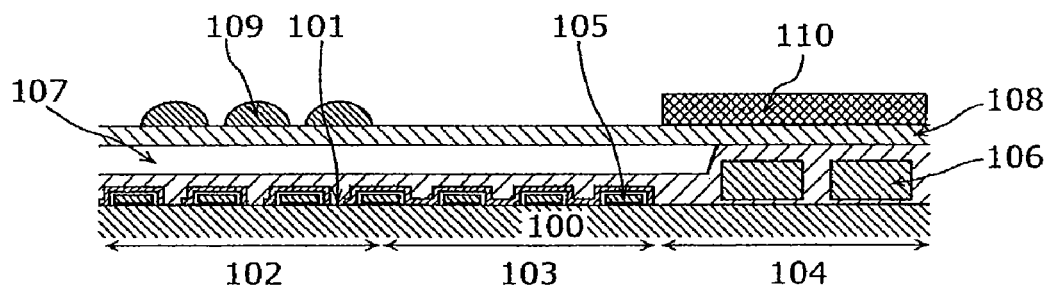
FIG. 7F shows the third method for manufacturing the solid-state imaging device according to the first embodiment.
Figure 7G:
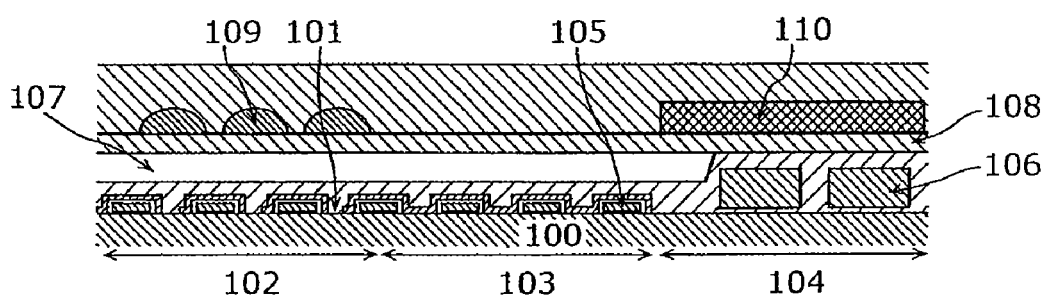
FIG. 7G shows the third method for manufacturing the solid-state imaging device according to the first embodiment.
Figure 8A:
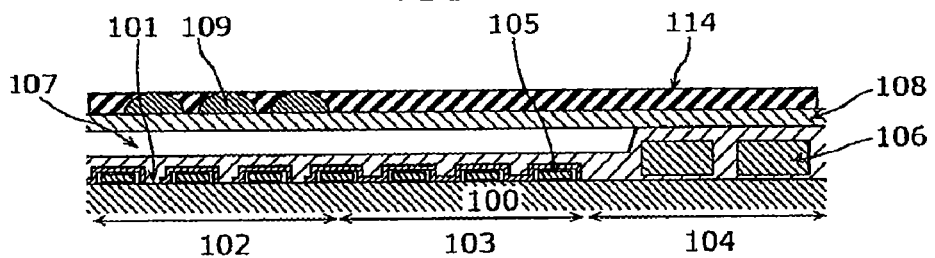
FIG. 8A shows the fourth method for manufacturing the solid-state imaging device according to the first embodiment.
Figure 8B:
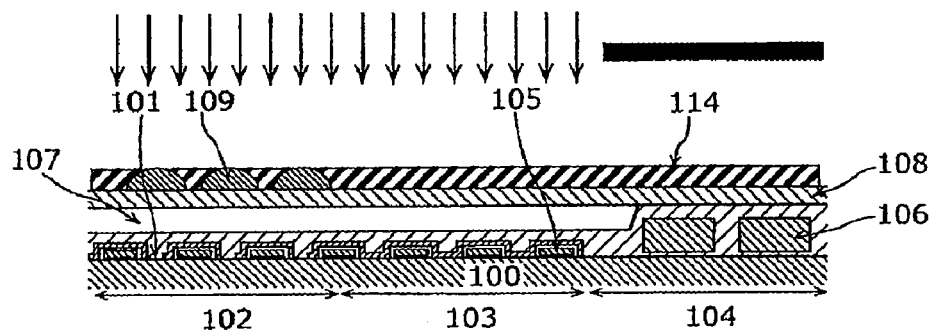
FIG. 8B shows the fourth method for manufacturing the solid-state imaging device according to the first embodiment.
Figure 8C:
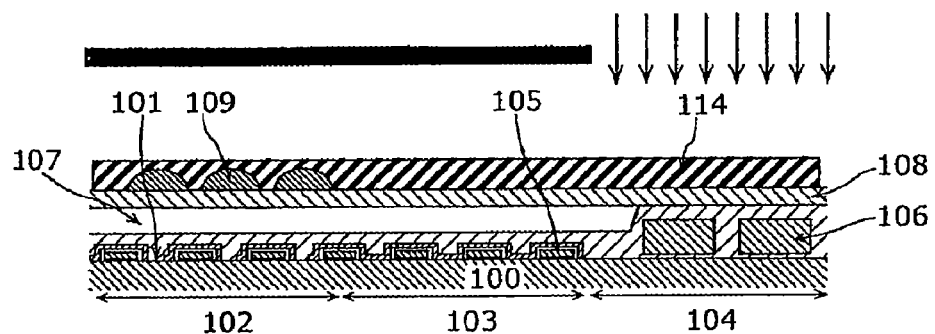
FIG. 8C shows the fourth method for manufacturing the solid-state imaging device according to the first embodiment.
Figure 8D:
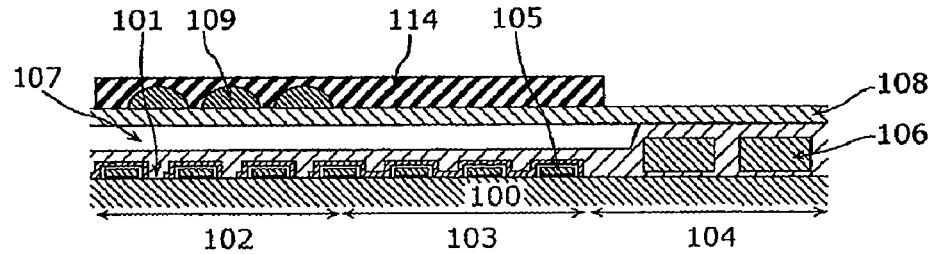
FIG. 8D shows the fourth method for manufacturing the solid-state imaging device according to the first embodiment.
Figure 8E:
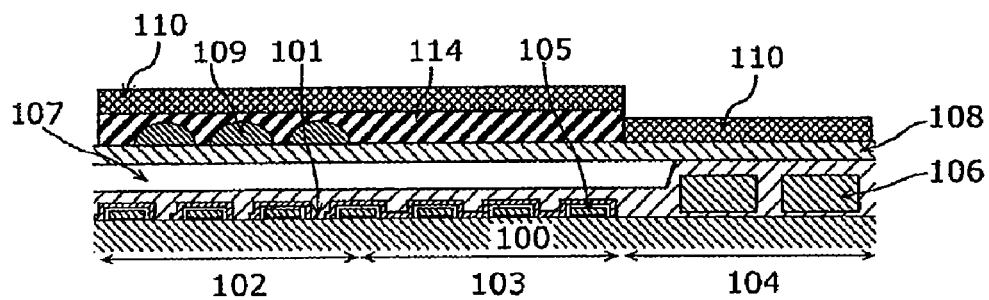
FIG. 8E shows the fourth method for manufacturing the solid-state imaging device according to the first embodiment.
Figure 8F:
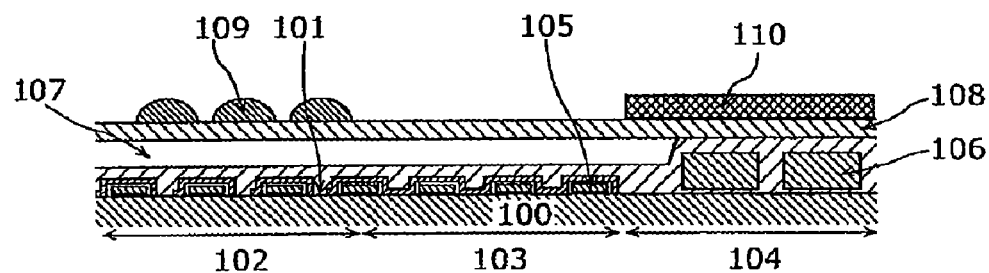
FIG. 8F shows the fourth method for manufacturing the solid-state imaging device according to the first embodiment.
Figure 8G:
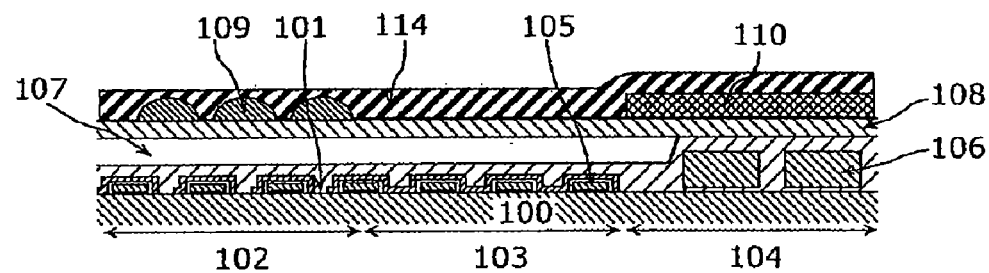
FIG. 8G shows the fourth method for manufacturing the solid-state imaging device according to the first embodiment.
Figure 8H:
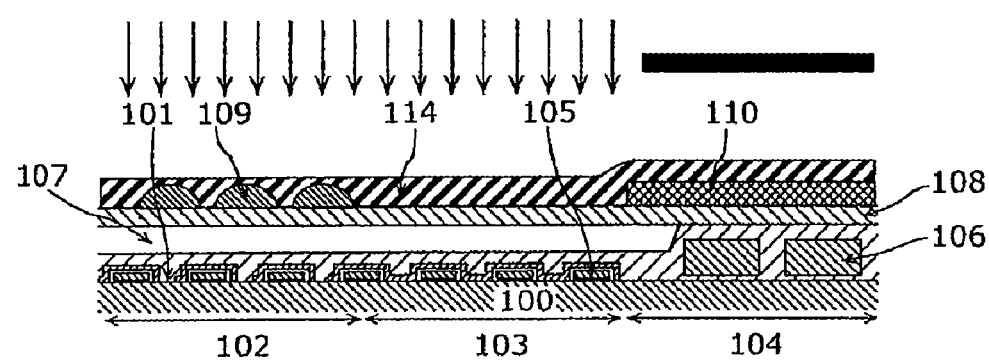
FIG. 8H shows the fourth method for manufacturing the solid-state imaging device according to the first embodiment.
Figure 8I:
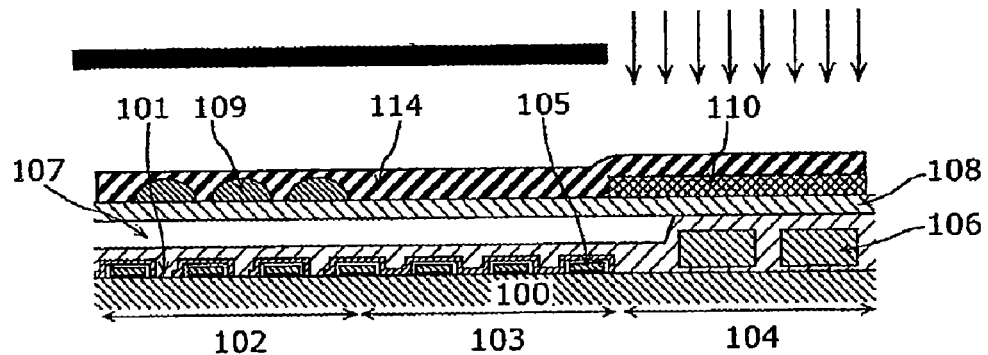
FIG. 8I shows the fourth method for manufacturing the solid-state imaging device according to the first embodiment.
Figure 8J:
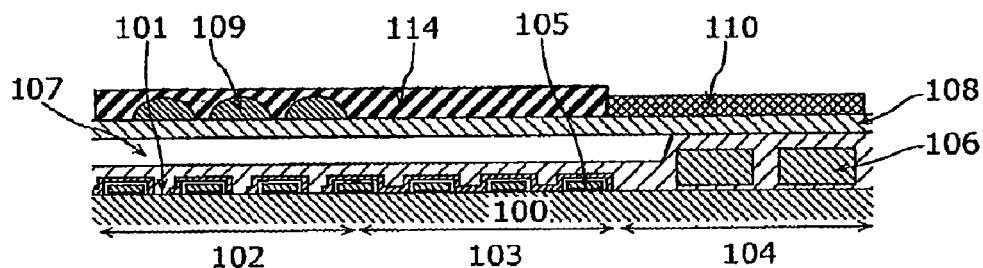
FIG. 8J shows the fourth method for manufacturing the solid-state imaging device according to the first embodiment.
Figure 8K:
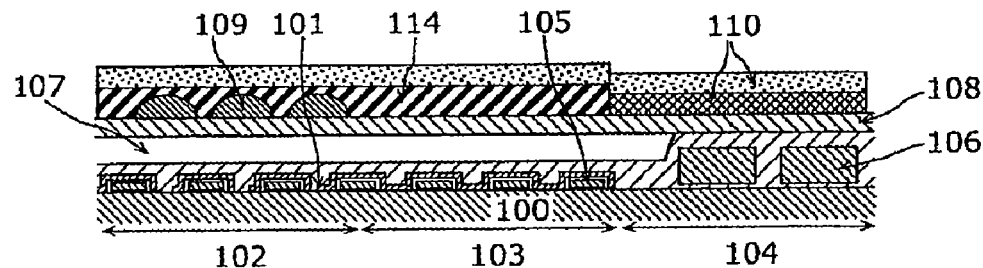
FIG. 8K shows the fourth method for manufacturing the solid-state imaging device according to the first embodiment.
Figure 8L:
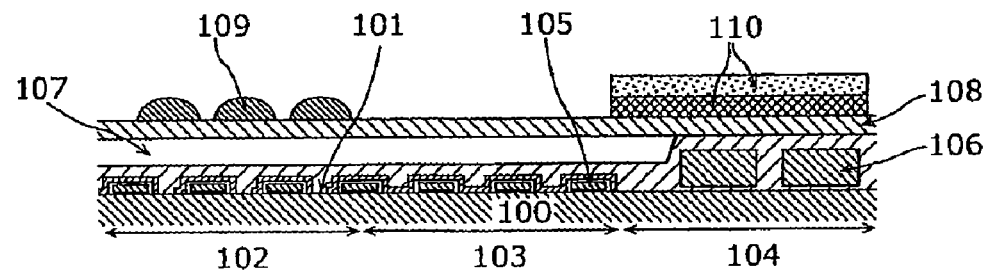
FIG. 8L shows the fourth method for manufacturing the solid-state imaging device according to the first embodiment.

Next, the resist is developed as shown in FIG. 7D, and further the antireflection film 110 is deposited as shown in FIG. 7E. Subsequently, the resist (P-SiN) 114 is removed, and the antireflection film 110 in the effective pixel region is removed (lift-off method) (FIG. 7F). Additionally, as shown in FIG. 7G, the transparent film 111 having a refractive index lower than that of the microlenses 109 is formed on the microlenses 109.

It is to be noted that, concerning the deposition, although there is a formation method by dry etching, as the microlenses 109 are etched in the cases of FIGS. 7A to 7G, a dry etching method cannot be used.

FIGS. 8A to 8L show the fourth method for manufacturing the solid-state imaging device according to the first embodiment. In the fourth method for manufacturing, a two-layer antireflection film is formed by deposition and a lift-off method.

Compared with the first method for manufacturing, the fourth method for manufacturing differs in that processes of FIGS. 8A to 8L, instead of FIGS. 5D to 5H, are included. Description of the same points is omitted, and the following description mainly focuses on different points.

After the microlenses 109 in FIG. 5C are formed, the antireflection film 110 is formed by placing a layer of the antireflection film 110 on top of another. That is to say, as shown in FIGS. 8A to 8F, the first layer is formed in the same manner as shown in FIGS. 7A to 7G, and the second layer is formed in the same manner as the first layer and as shown in FIGS. 8G to 8L.

Furthermore, because, in the case where the antireflection film 110 is formed before the microlenses 109, spin coat application of the microlenses 109 to an area where a step is formed causes unevenness in application, a variation in size of the microlenses 109 in the effective pixel region, and an adverse impact on image quality, sensitivity, and smear, the microlenses 109 are formed in advance.

As described above, the solid-state imaging device according to the first embodiment of the present invention is characterized in that at least the antireflection film 110 is formed in the same layer as the microlenses 109 in the peripheral area excluding the effective pixel region 102 and the OB region 103, and formed by covering a surface of the solid-state imaging device 110 with the transparent film 111 having a lower refractive index.

Consequently, as only the transparent film (intermediate film) 108 for optimizing light collection exists under the microlenses 109, it is possible to broaden design freedom without being limited by the film thickness of the antireflection film 110. Further, as it becomes easy to focus the light entering one pixel of the microlens 109 on the light receiving unit, it becomes possible to optimize the light collection while ensuring the flare reduction. The light collection optimization allows the sensitivity improvement.

It is to be noted that the above term "light collection optimization", when described more specifically and technically, refers to controlling of the film thickness of the transparent film (intermediate film) 108 under microlens and focusing on the light receiving unit.

Additionally, with the method for manufacturing the solid-state imaging device according to the first embodiment of the present invention, after the antireflection film 110 is applied, exposed, and developed (in the case of dyeing, dyed) following the formation of the microlenses 109 or the resist (P-SiN) 114 for patterning the antireflection film 110 to be deposited is applied, exposed, and developed, the antireflection film 110 is deposited and developed for the lift-off to be formed. Subsequently, the transparent film having the refractive index lower than that of the microlenses 109 is formed. Accordingly, as it becomes unnecessary to form the antireflection film 110 under the microlenses 109, the design freedom for the film thickness of the transparent film (intermediate film) 108 under microlens is broadened, which allows the sensitivity and smear to be optimized.

Figure 15A:
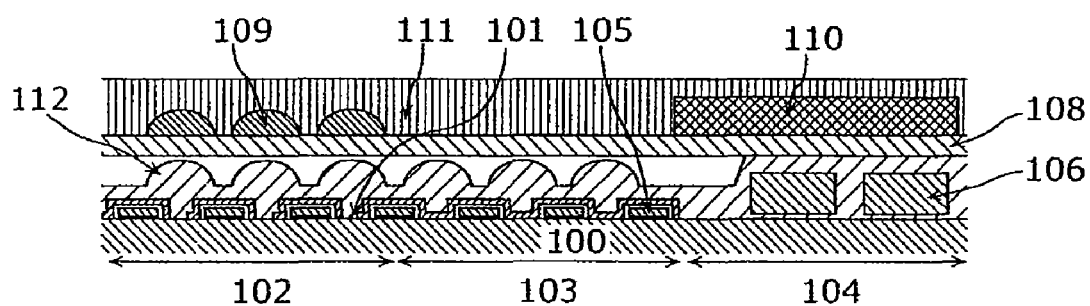
FIG. 15A shows an example of a cross-sectional structure of a CCD image sensor having an inner-layer lens according to the first embodiment.
Figure 16A:
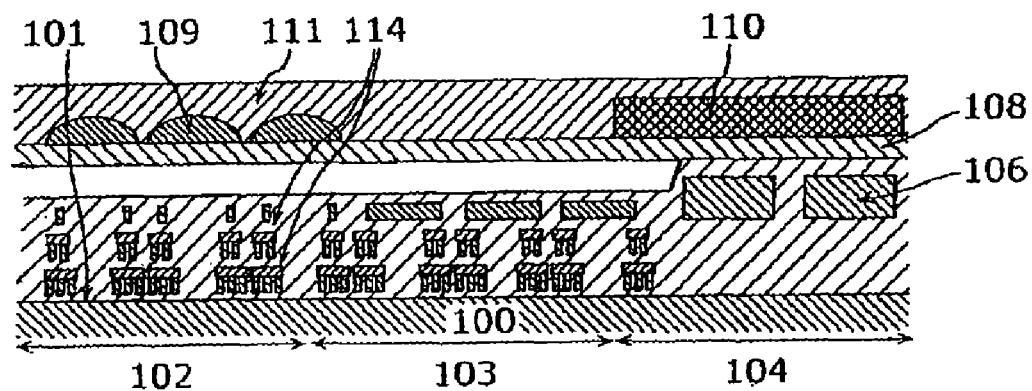
FIG. 16A shows an example of a cross-sectional structure of a MOS image sensor without an inner-layer lens according to the first embodiment.
Figure 16B:
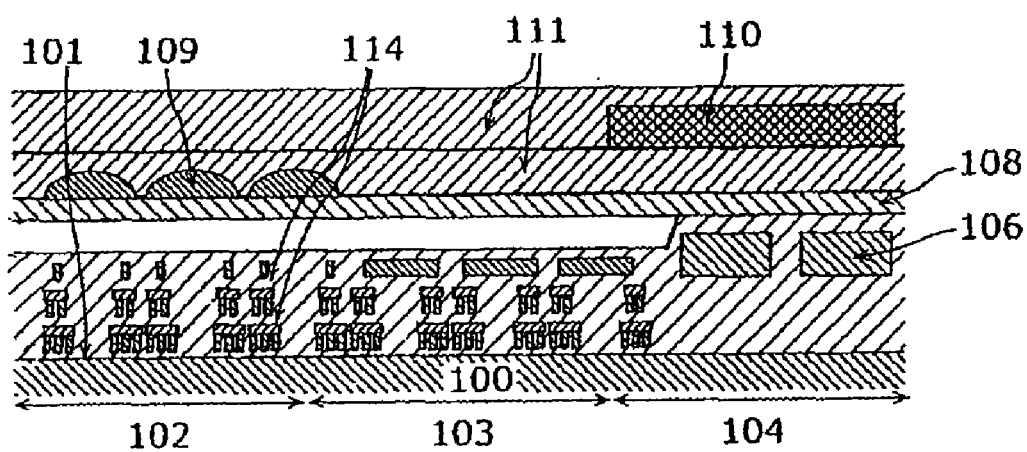
FIG. 16B shows an example of a cross-sectional structure of a MOS image sensor without an inner-layer lens according to the second embodiment.
Figure 16C:
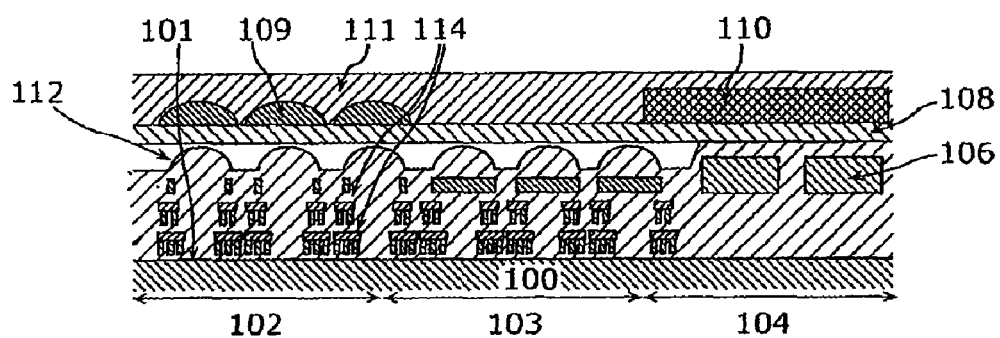
FIG. 16C shows an example of a cross-sectional structure of a MOS image sensor having an inner-layer lens according to the first embodiment.

It is to be noted that the solid-state imaging device according to the first embodiment of the present invention can be used for a CCD image sensor including intralayer lenses 112 as shown in FIG. 15A, and for a MOS image sensor as shown in FIG. 16C.

Second Embodiment

The following describes a solid-state imaging device and a method for manufacturing the solid-state imaging device according to a second embodiment of the present invention with reference to the drawings.

Figure 4:
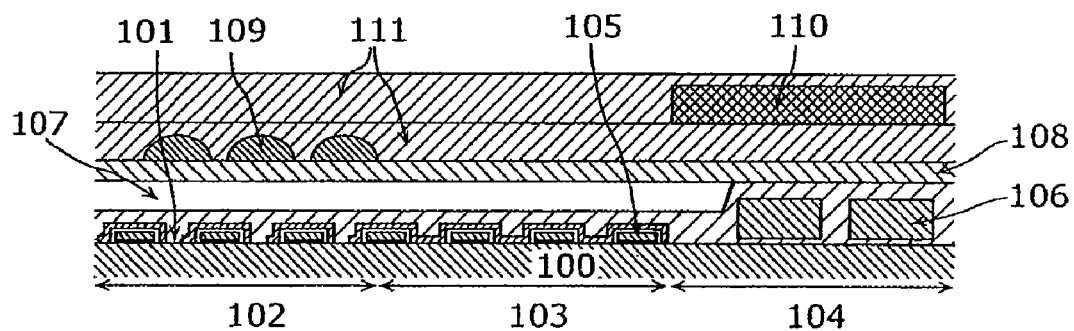
FIG. 4 shows a cross-sectional structure of a solid-state imaging device according to a second embodiment.

FIG. 4 shows a structural cross-section view of the solid-state imaging device according to the second embodiment of the present invention.

As shown in FIG. 4, the effective pixel region 102 and the optical black (OB) region 103 are formed on the semiconductor substrate 100 by a diffusion process, and a wire 106 is formed in a peripheral region of the OB region 103. Subsequently, the planarizing film 107 is applied.

Moreover, the effective pixel region 102 has the intermediate film 108 which is designed to have a desirable thickness (film thickness which allows light entering microlenses to focus on the light receiving units) for light collection optimization according to a cell size, and the microlenses 109 are formed on the intermediate film 108. Additionally, the antireflection film 110 formed in a peripheral area excluding the effective pixel region 102 and the OB region 103 is formed on the transparent film 111 having a refractive index lower than that of the microlenses 109.

Next, the first to the sixth methods for manufacturing the solid-state imaging device shown in FIG. 4 will be described with reference to the drawings.

FIGS. 9A to 9J show the first method for manufacturing the solid-state imaging device according to the second embodiment. In the first method for manufacturing, a single-layer antireflection film is formed by application, exposure, and development.

Figure 9A:
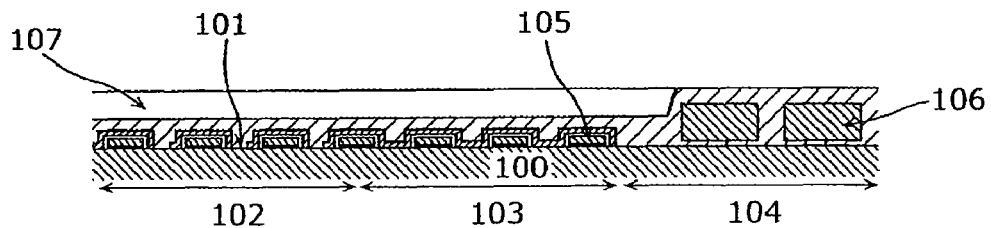
FIG. 9A shows the first method for manufacturing the solid-state imaging device according to the second embodiment.
Figure 9B:
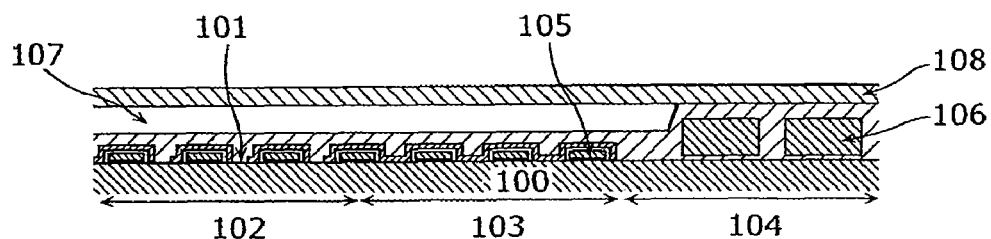
FIG. 9B shows the first method for manufacturing the solid-state imaging device according to the second embodiment.
Figure 9C:
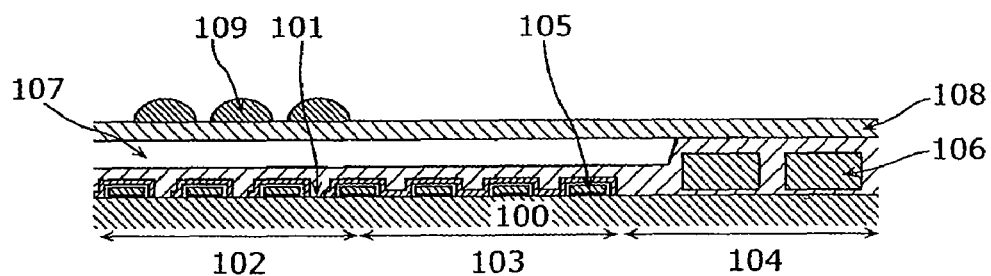
FIG. 9C shows the first method for manufacturing the solid-state imaging device according to the second embodiment.

First, similar to FIGS. 5A to 5C, after the planarizing film is applied and the transparent film (intermediate film) 108 under microlens and the microlenses 109 are formed as shown in FIGS. 9A to 9C, the transparent film 111 having a refractive index lower than that of the microlenses 109 is applied.

Figure 9D:
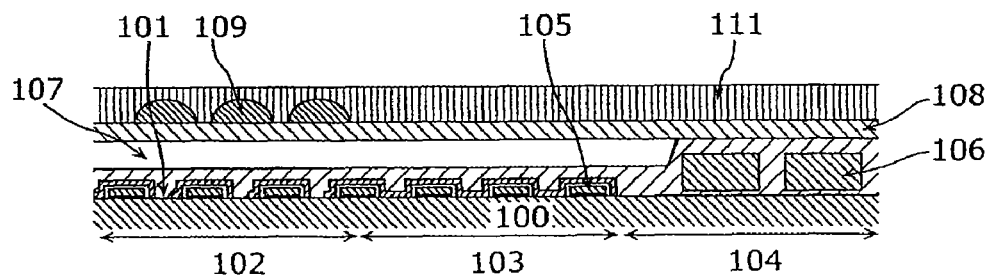
FIG. 9D shows the first method for manufacturing the solid-state imaging device according to the second embodiment.
Figure 9E:
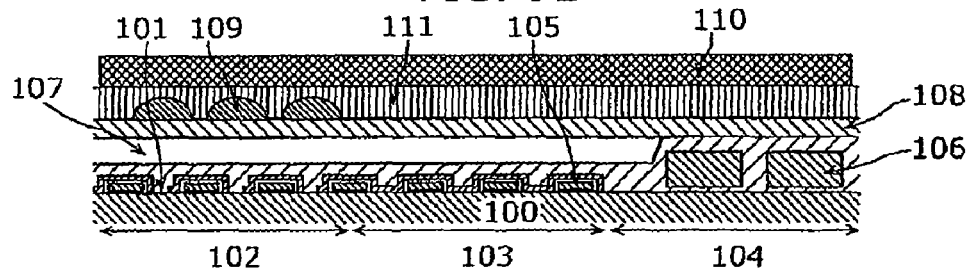
FIG. 9E shows the first method for manufacturing the solid-state imaging device according to the second embodiment.

Next, the resist for forming the antireflection film 110 is applied as shown in FIG. 9E.

Figure 9F:
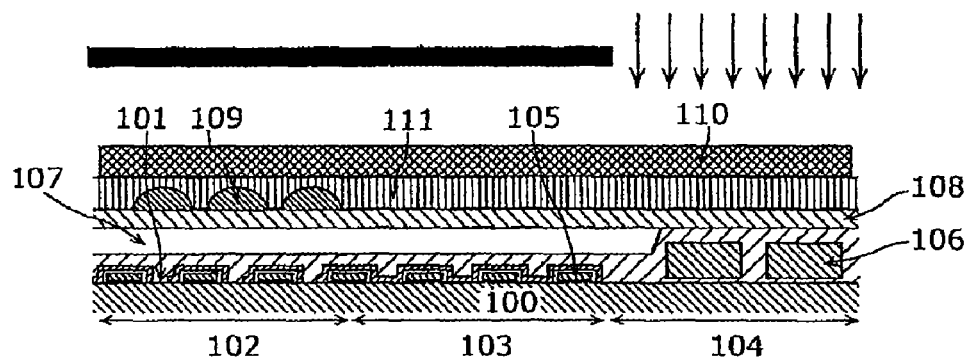
FIG. 9F shows the first method for manufacturing the solid-state imaging device according to the second embodiment.
Figure 9G:
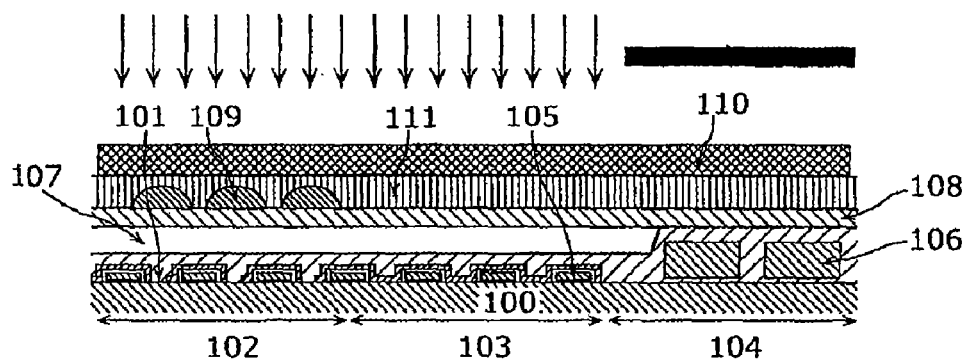
FIG. 9G shows the first method for manufacturing the solid-state imaging device according to the second embodiment.

Next, in the case of the negative resist, the antireflection film 110 is exposed as shown in FIG. 9F. It is to be noted that, in the case of the positive resist, the antireflection film 110 is exposed as shown in FIG. 9G.

Figure 9H:
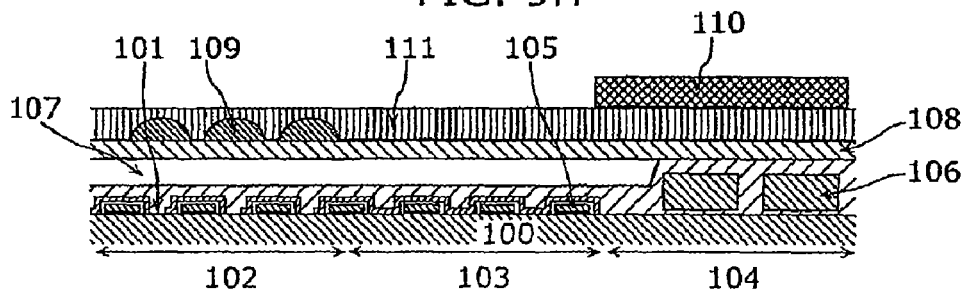
FIG. 9H shows the first method for manufacturing the solid-state imaging device according to the second embodiment.
Figure 9I:
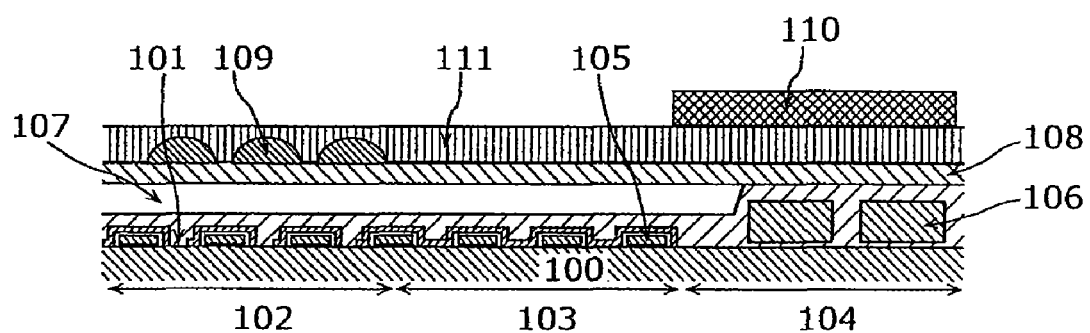
FIG. 9I shows the first method for manufacturing the solid-state imaging device according to the second embodiment.
Figure 9J:
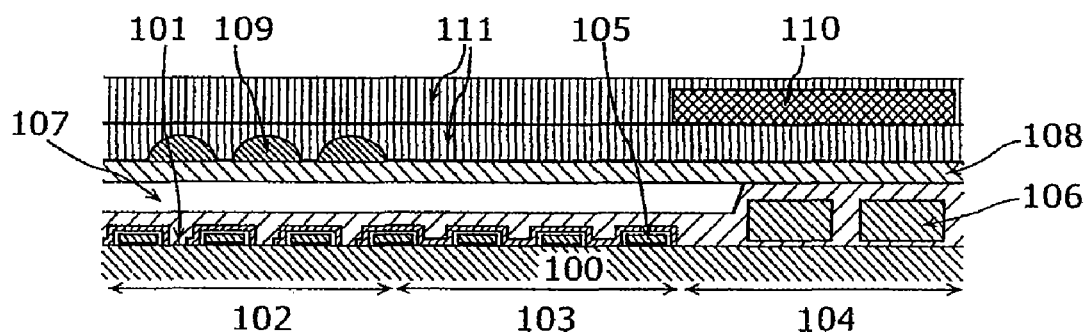
FIG. 9J shows the first method for manufacturing the solid-state imaging device according to the second embodiment.

Next, the antireflection film 110 is developed as shown in FIG. 9H. Subsequently, the transparent film 111 having the refractive index lower than that of the microlenses 109 is applied. In the case where dyeing is necessary, the antireflection film 110 is dyed as shown in FIG. 9I. Lastly, the transparent film 111 having the refractive index lower than that of the microlenses is formed as shown in FIG. 9J.

FIGS. 10A to 10K show the second method for manufacturing the solid-state imaging device according to the second embodiment. In the second method for manufacturing, a two-layer antireflection film is formed by application, exposure, and development (dyeing).

Compared with the first method for manufacturing according to the second embodiment, the second method for manufacturing differs in that processes of FIGS. 10A to 10K, instead of FIGS. 9E to 9J, are included. Description of the same points is omitted, and the following description mainly focuses on different points.

Figure 10A:
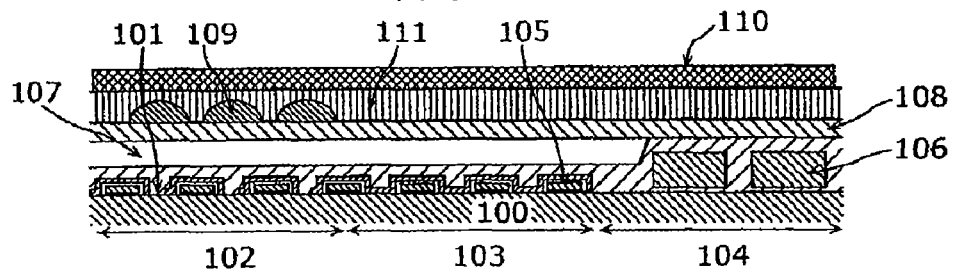
FIG. 10A shows the second method for manufacturing the solid-state imaging device according to the second embodiment.
Figure 10B:
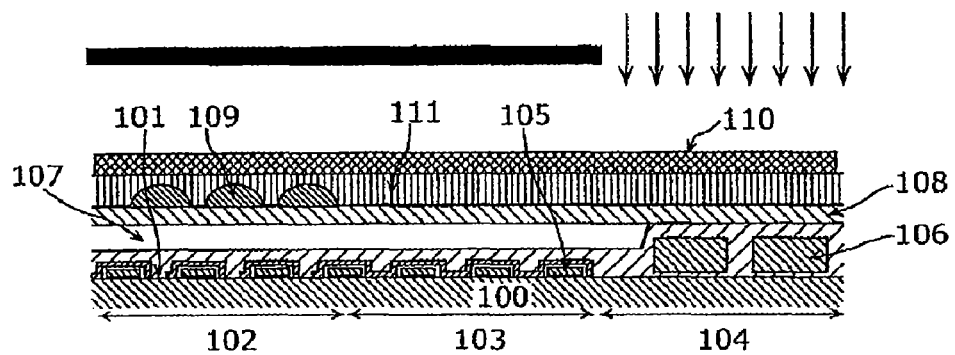
FIG. 10B shows the second method for manufacturing the solid-state imaging device according to the second embodiment.
Figure 10C:
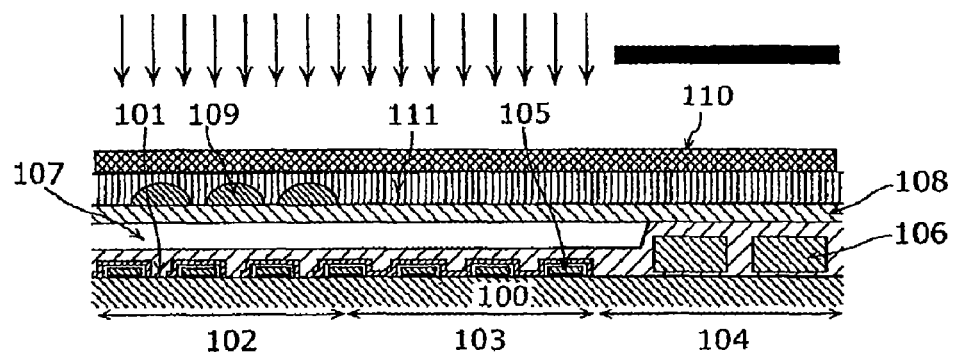
FIG. 10C shows the second method for manufacturing the solid-state imaging device according to the second embodiment.
Figure 10D:
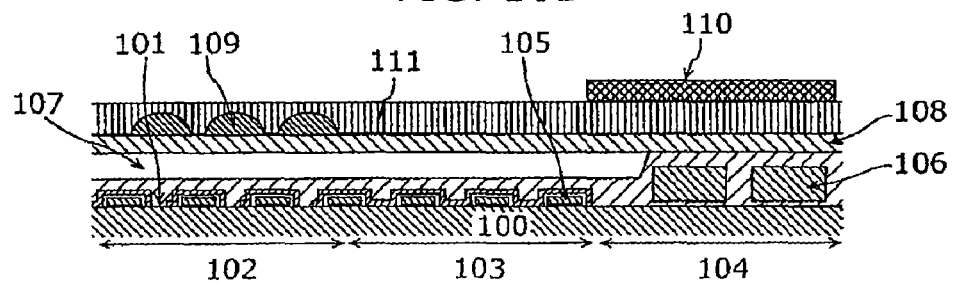
FIG. 10D shows the second method for manufacturing the solid-state imaging device according to the second embodiment.
Figure 10E:
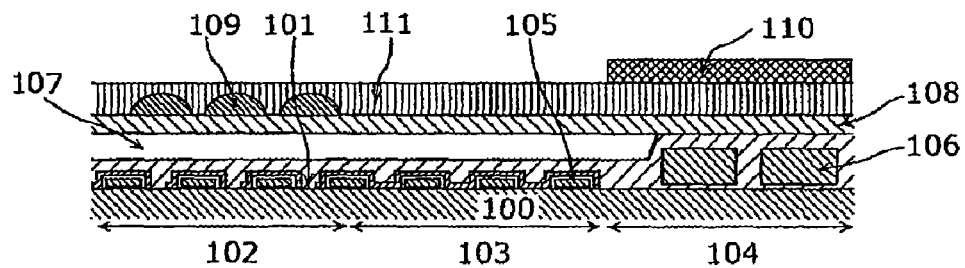
FIG. 10E shows the second method for manufacturing the solid-state imaging device according to the second embodiment.
Figure 10F:
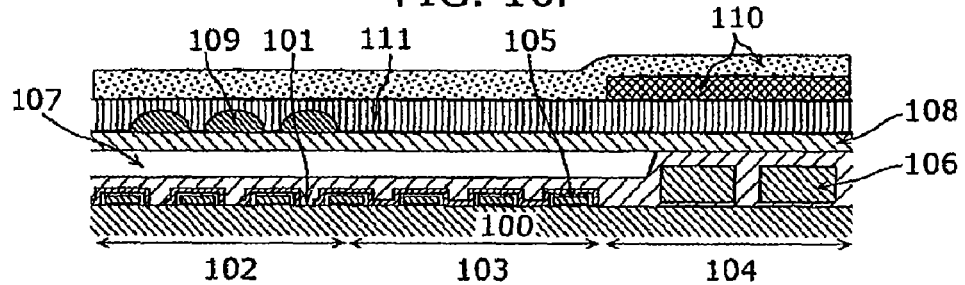
FIG. 10F shows the second method for manufacturing the solid-state imaging device according to the second embodiment.
Figure 10G:
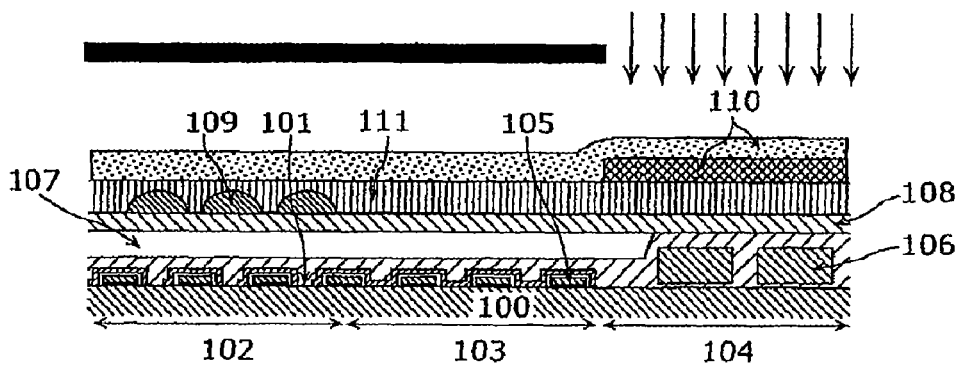
FIG. 10G shows the second method for manufacturing the solid-state imaging device according to the second embodiment.
Figure 10H:
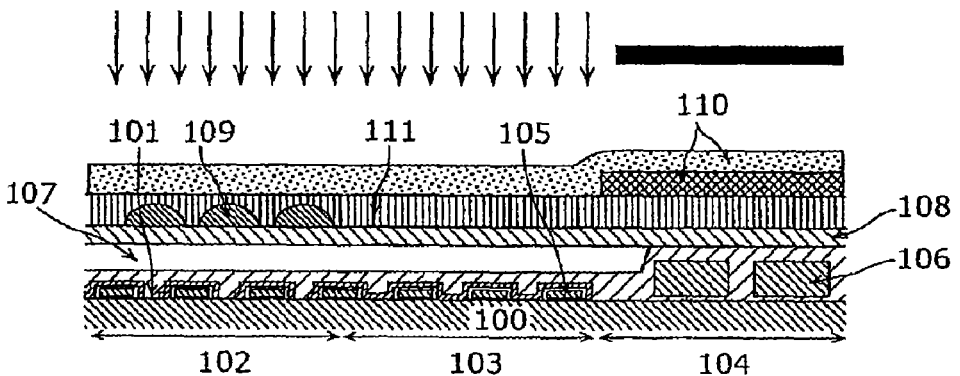
FIG. 10H shows the second method for manufacturing the solid-state imaging device according to the second embodiment.
Figure 10I:
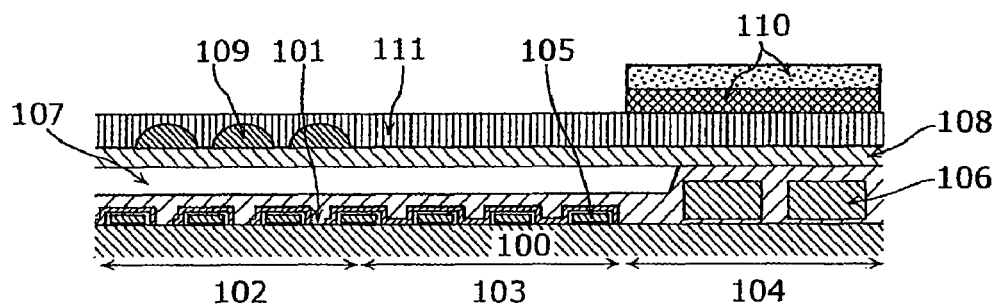
FIG. 10I shows the second method for manufacturing the solid-state imaging device according to the second embodiment.
Figure 10J:
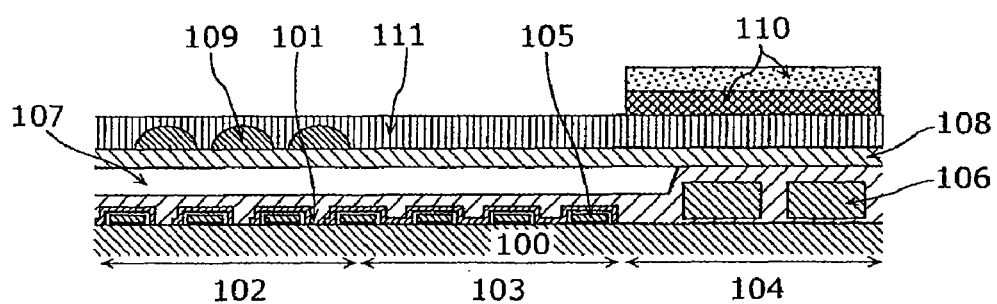
FIG. 10J shows the second method for manufacturing the solid-state imaging device according to the second embodiment.
Figure 10K:
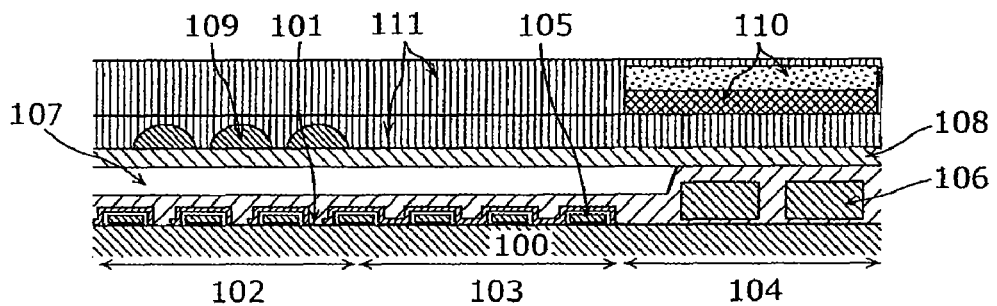
FIG. 10K shows the second method for manufacturing the solid-state imaging device according to the second embodiment.

After the transparent film 111 in FIG. 9D is formed, the antireflection film is formed by placing a layer of the antireflection film on top of another. That is to say, as shown in FIGS. 10A to 10E, the first layer is formed in the same manner as shown in FIGS. 9E to 9I. As shown in FIGS. 10F to 10J, the second layer is formed in the same manner as the first layer, and finally the transparent film 111 having the refractive index lower than that of the microlenses 109 is formed as shown in FIG. 10K.

FIGS. 11A to 11G show the third method for manufacturing the solid-state imaging device according to the second embodiment. In the third method for manufacturing, a single-layer antireflection film is formed by the deposition and the lift-off method.

Compared with the first method for manufacturing according to the second embodiment, the third method for manufacturing differs in that processes of FIGS. 11A to 11G, instead of FIGS. 9E to 9J, are included. Description of the same points is omitted, and the following description mainly focuses on different points.

Figure 11A:
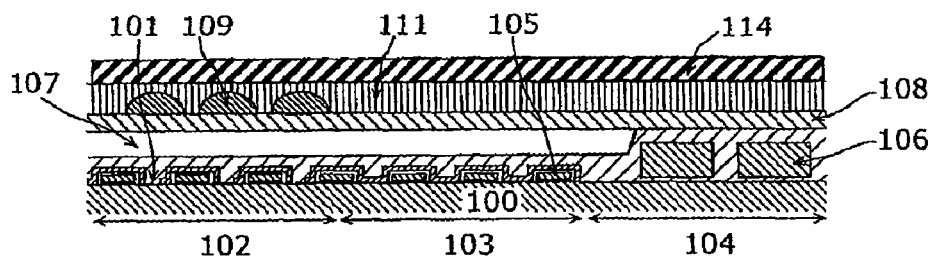
FIG. 11A shows the third method for manufacturing the solid-state imaging device according to the second embodiment.
Figure 11B:
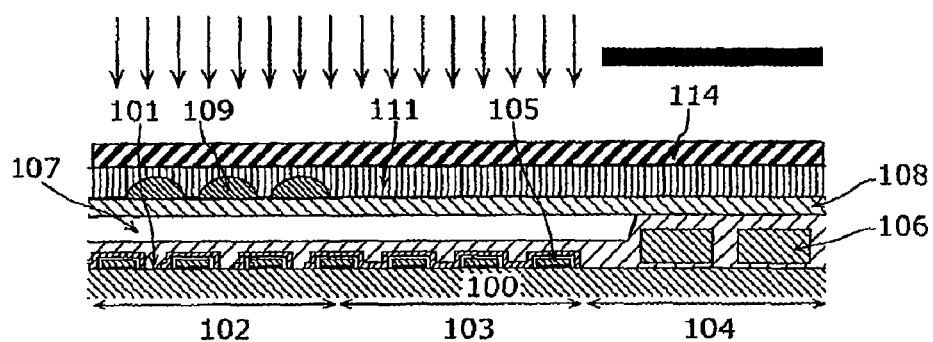
FIG. 11B shows the third method for manufacturing the solid-state imaging device according to the second embodiment.
Figure 11C:
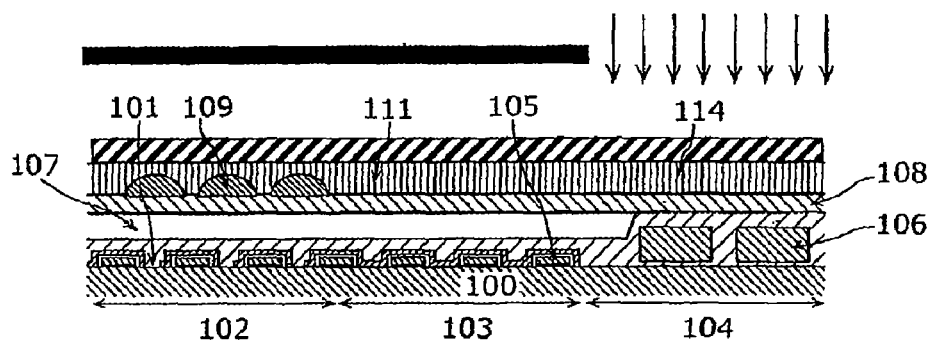
FIG. 11C shows the third method for manufacturing the solid-state imaging device according to the second embodiment.
Figure 11D:
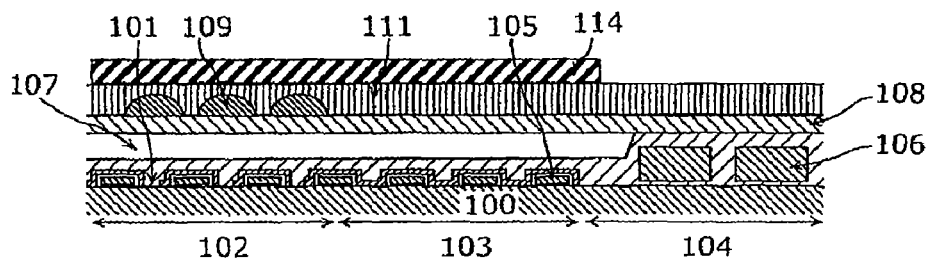
FIG. 11D shows the third method for manufacturing the solid-state imaging device according to the second embodiment.

After the transparent film 111 in FIG. 9D is formed, the single-layer antireflection film 110 is formed by the deposition and the lift-off method. That is to say, after the transparent film 111 is formed on the microlenses 109, the resist is applied as shown in FIG. 11A, exposed as shown in FIG. 11B or 11C, and developed as shown in FIG. 11D, so as to be left in effective pixels. Subsequently, the antireflection film 110 is deposited as shown in FIG. 11E, and the resist is removed as shown in FIG. 11F. Lastly, the transparent film 111 having the refractive index lower than that of the microlenses 109 is formed as shown in FIG. 11G.

FIGS. 12A to 12H show the fourth method for manufacturing the solid-state imaging device according to the second embodiment. In the fourth method for manufacturing, a single-layer antireflection film is formed by the deposition and the dry etching method.

Compared with the first method for manufacturing according to the second embodiment, the fourth method for manufacturing differs in that processes of FIGS. 12A to 12H, instead of FIGS. 9E to 9J, are included. Description of the same points is omitted, and the following description mainly focuses on different points.

Figure 12A:
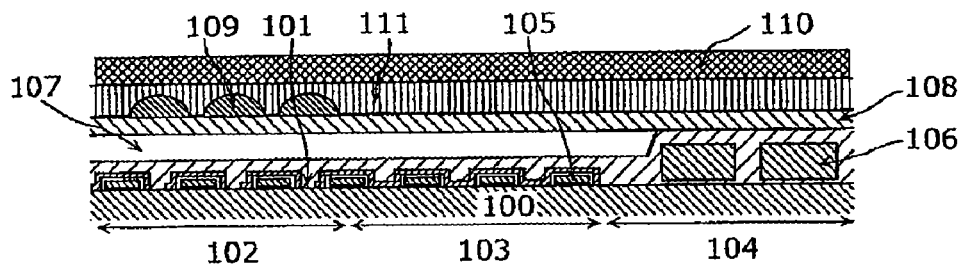
FIG. 12A shows the fourth method for manufacturing the solid-state imaging device according to the second embodiment.
Figure 12B:
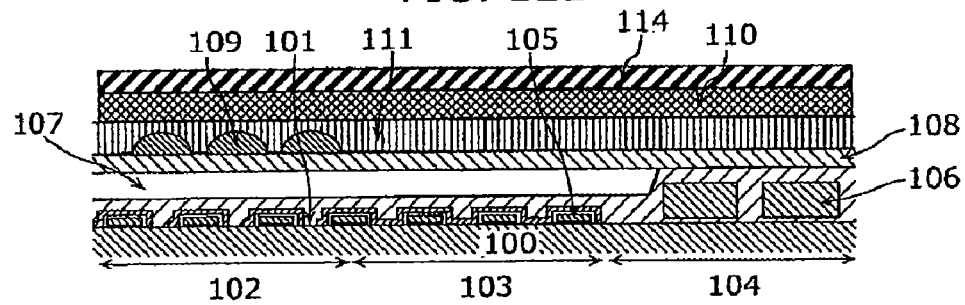
FIG. 12B shows the fourth method for manufacturing the solid-state imaging device according to the second embodiment.
Figure 12C:
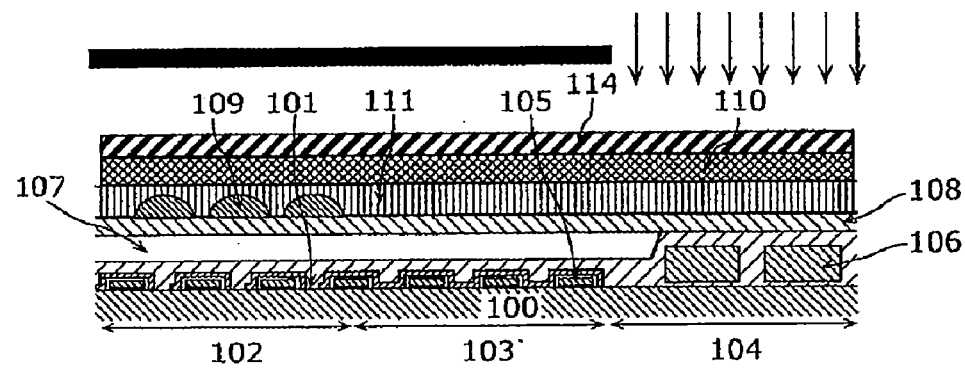
FIG. 12C shows the fourth method for manufacturing the solid-state imaging device according to the second embodiment.
Figure 12D:
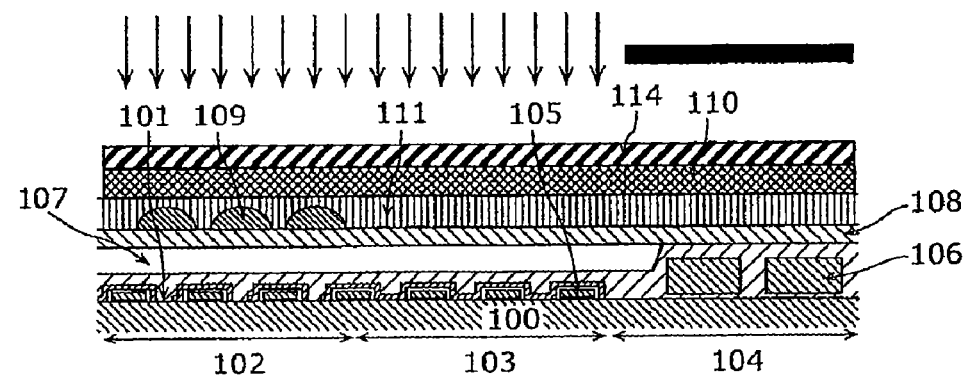
FIG. 12D shows the fourth method for manufacturing the solid-state imaging device according to the second embodiment.
Figure 12E:
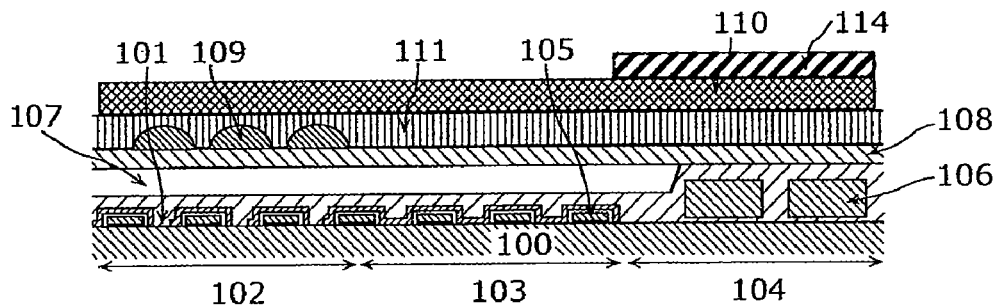
FIG. 12E shows the fourth method for manufacturing the solid-state imaging device according to the second embodiment.
Figure 12F:
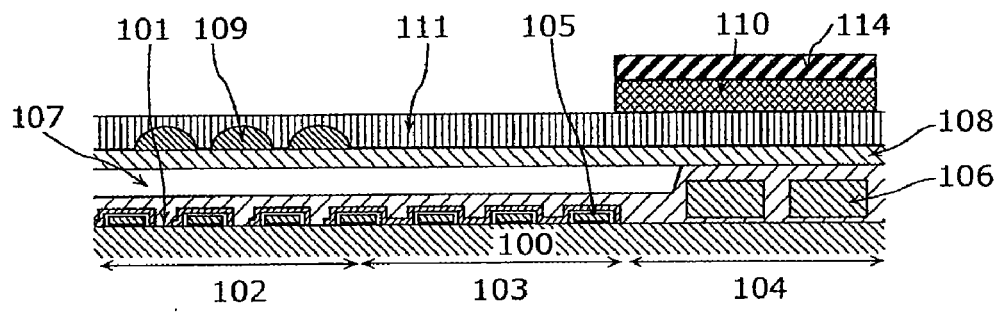
FIG. 12F shows the fourth method for manufacturing the solid-state imaging device according to the second embodiment.
Figure 12G:
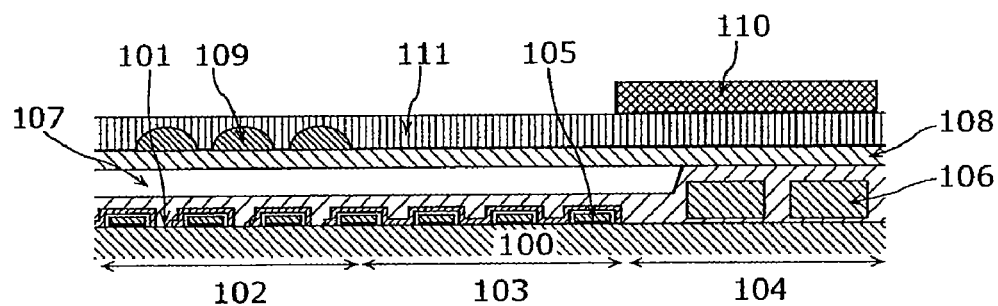
FIG. 12G shows the fourth method for manufacturing the solid-state imaging device according to the second embodiment.
Figure 12H:
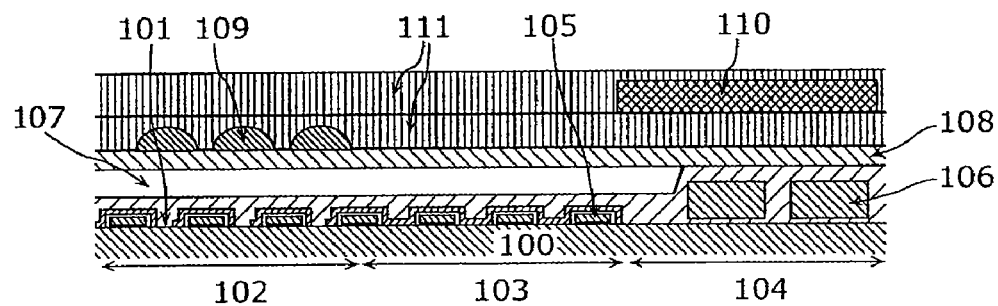
FIG. 12H shows the fourth method for manufacturing the solid-state imaging device according to the second embodiment.

After the transparent film 111 in FIG. 9D is formed, the single-layer antireflection film 110 is formed by the deposition and the dry etching method. That is to say, after the planarizing film is applied and the transparent film (intermediate film) 108 under microlens and the microlenses 109 are formed, the antireflection film 110 is deposited as shown in FIG. 12A, and then the resist is applied as shown in FIG. 12B. The resist is developed as shown in FIG. 12C (or FIG. 12E after the exposure as shown in FIG. 12D), and patterned. After the patterning, the antireflection film 110 is left, by dry etching as shown in FIG. 12F, only in the peripheral region 104 excluding at least the effective pixel region 102 and the OB region 103. Subsequently, the resist is removed as shown in FIG. 12G, and the transparent film 111 is applied as shown in FIG. 12H.

FIGS. 13A to 13M show the fifth method for manufacturing the solid-state imaging device according to the second embodiment. In the fifth method for manufacturing, a two-layer antireflection film is formed by the deposition and the lift-off method.

Compared with the first method for manufacturing according to the second embodiment, the fifth method for manufacturing differs in that processes of FIGS. 13A to 13M, instead of FIGS. 9E to 9J, are included. Description of the same points is omitted, and the following description mainly focuses on different points.

Figure 13A:
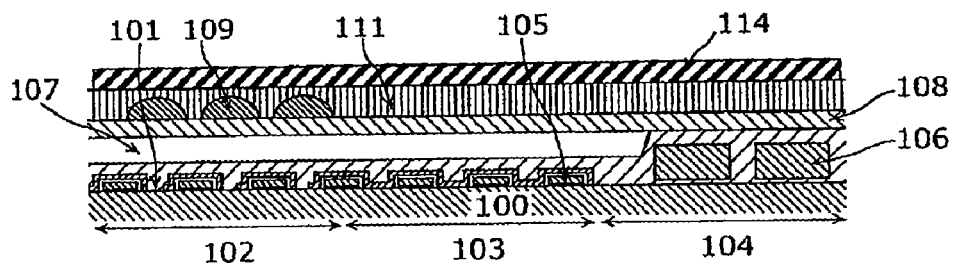
FIG. 13A shows the fifth method for manufacturing the solid-state imaging device according to the second embodiment.
Figure 13B:
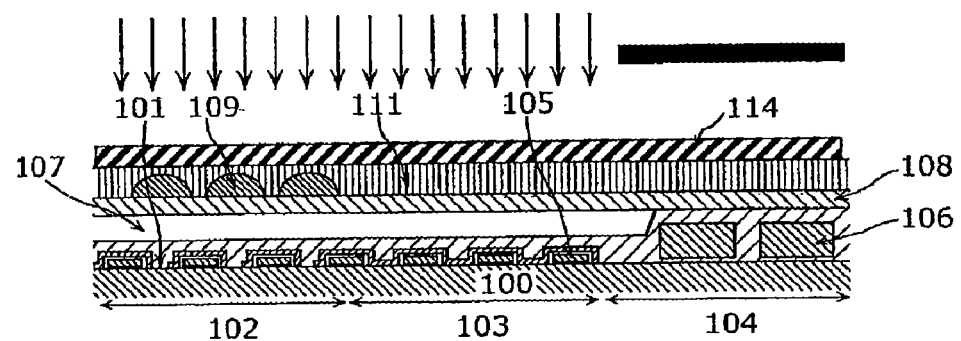
FIG. 13B shows the fifth method for manufacturing the solid-state imaging device according to the second embodiment.
Figure 13C:
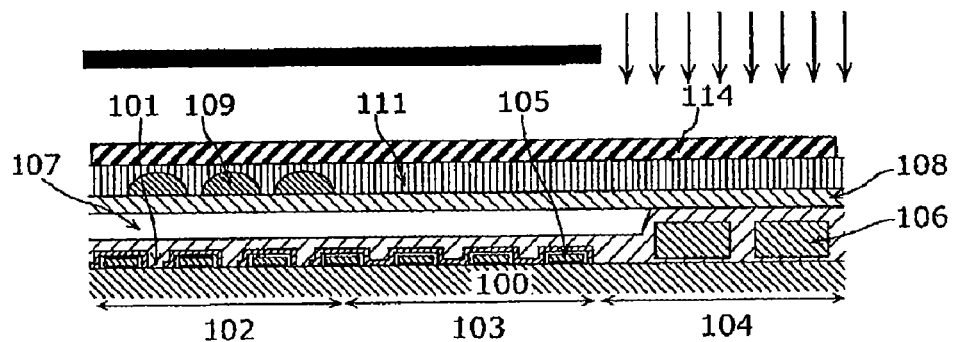
FIG. 13C shows the fifth method for manufacturing the solid-state imaging device according to the second embodiment.
Figure 13D:
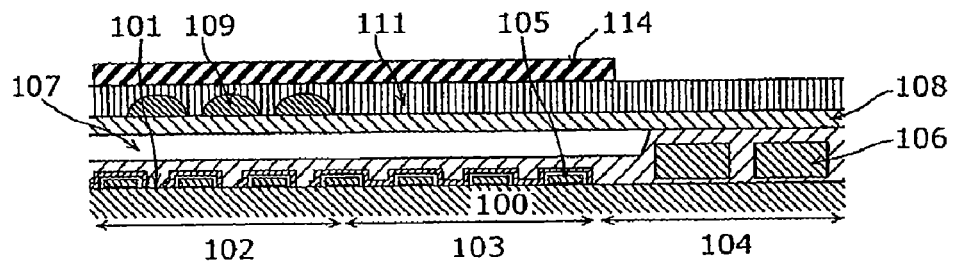
FIG. 13D shows the fifth method for manufacturing the solid-state imaging device according to the second embodiment.
Figure 13E:
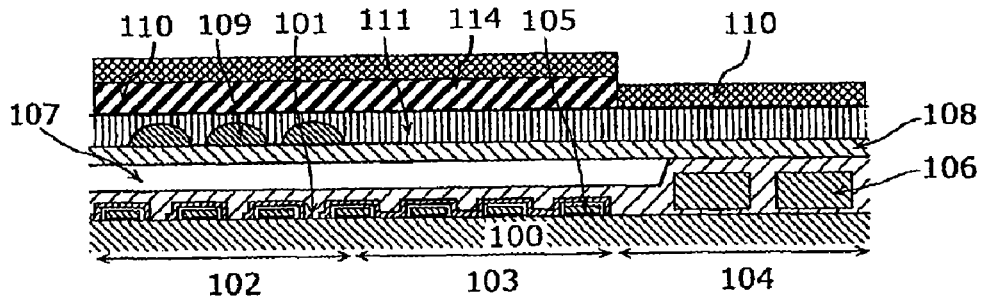
FIG. 13E shows the fifth method for manufacturing the solid-state imaging device according to the second embodiment.
Figure 13F:
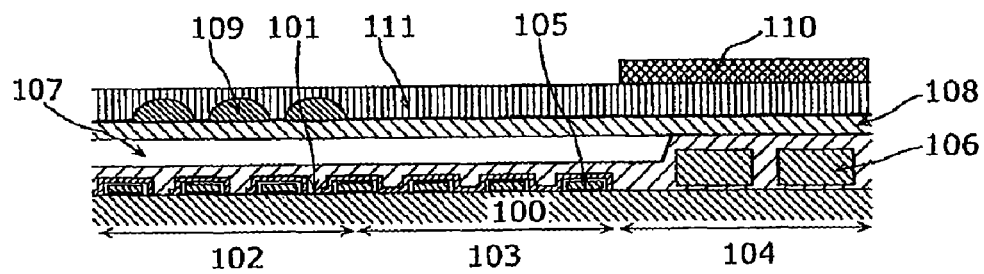
FIG. 13F shows the fifth method for manufacturing the solid-state imaging device according to the second embodiment.
Figure 13G:
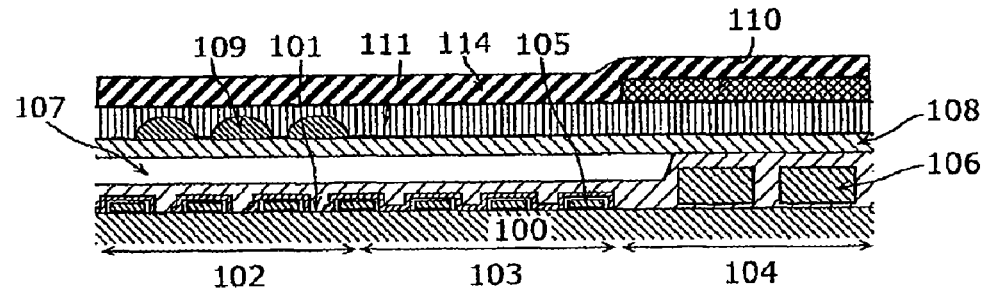
FIG. 13G shows the fifth method for manufacturing the solid-state imaging device according to the second embodiment.
Figure 13H:
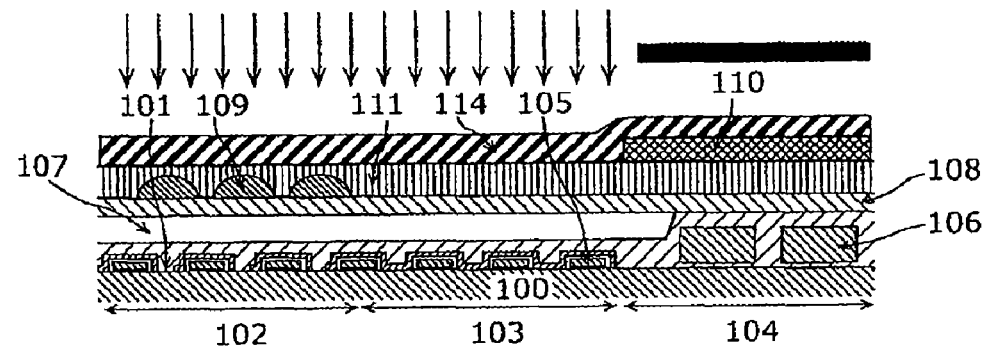
FIG. 13H shows the fifth method for manufacturing the solid-state imaging device according to the second embodiment.
Figure 13I:
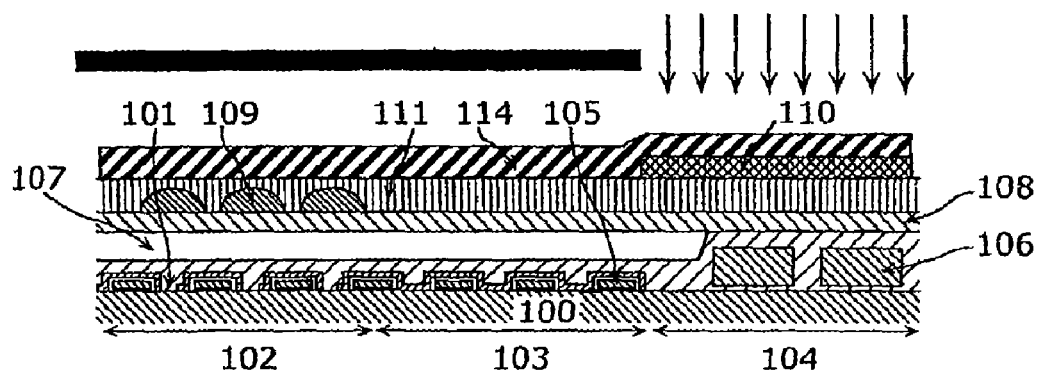
FIG. 13I shows the fifth method for manufacturing the solid-state imaging device according to the second embodiment.
Figure 13J:
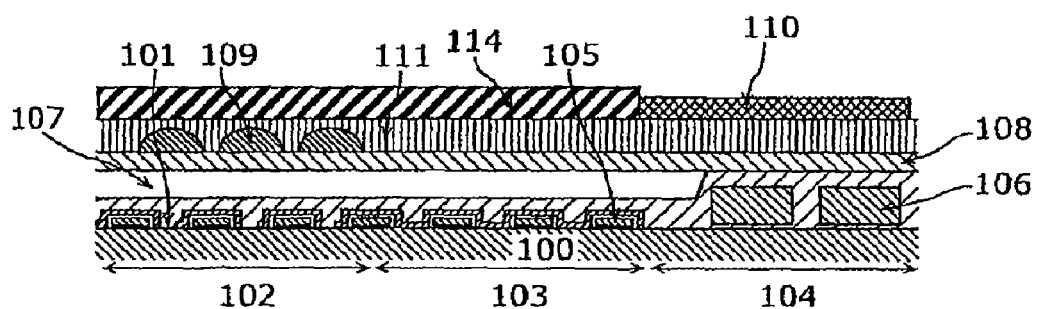
FIG. 13J shows the fifth method for manufacturing the solid-state imaging device according to the second embodiment.
Figure 13K:
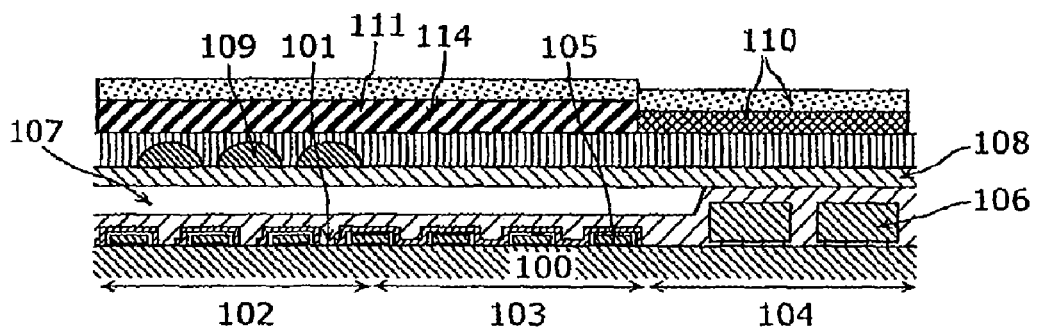
FIG. 13K shows the fifth method for manufacturing the solid-state imaging device according to the second embodiment.
Figure 13L:
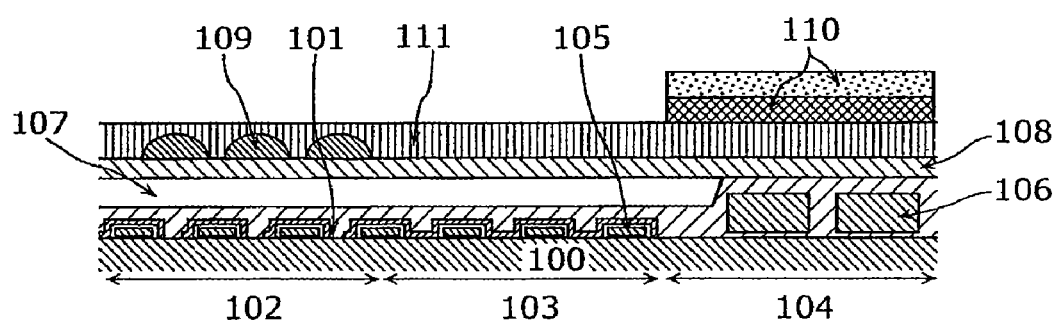
FIG. 13L shows the fifth method for manufacturing the solid-state imaging device according to the second embodiment.
Figure 13M:
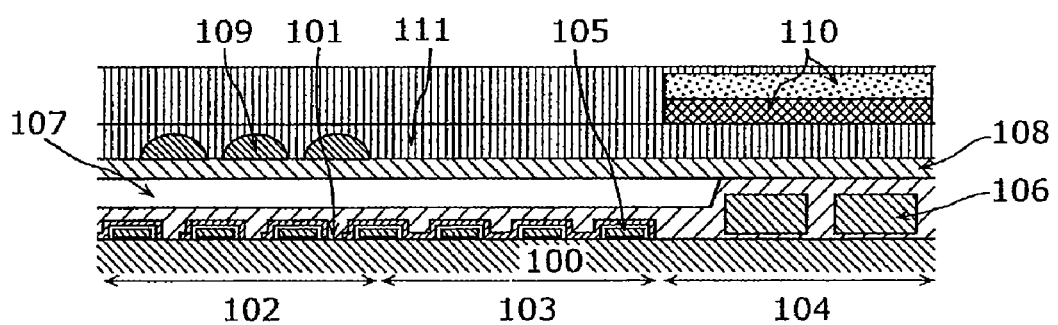
FIG. 13M shows the fifth method for manufacturing the solid-state imaging device according to the second embodiment.

After the transparent film 111 in FIG. 9D is formed, the two-layer antireflection film is formed by the deposition and the lift-off method. That is to say, as shown in FIGS. 13A to 13F, the first layer is formed in the same manner as shown in FIGS. 11A to 11E, and the second layer is formed in the same manner as shown in FIGS. 13G to 13L. Finally, as shown in FIG. 13M, a transparent film having the low refractive index is formed by application.

Figure 14A:
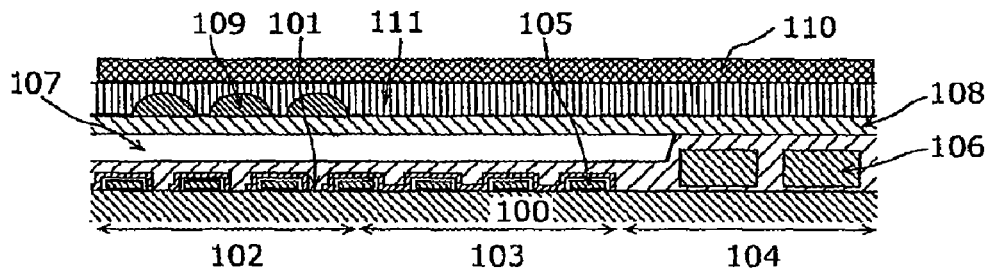
FIG. 14A shows the sixth method for manufacturing the solid-state imaging device according to the second embodiment.
Figure 14B:
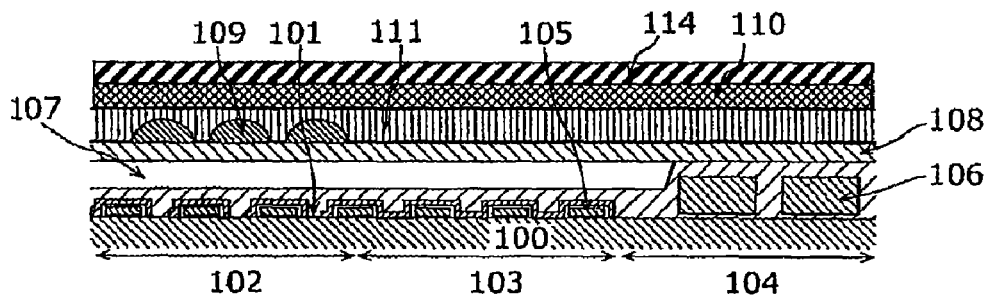
FIG. 14B shows the sixth method for manufacturing the solid-state imaging device according to the second embodiment.
Figure 14C:
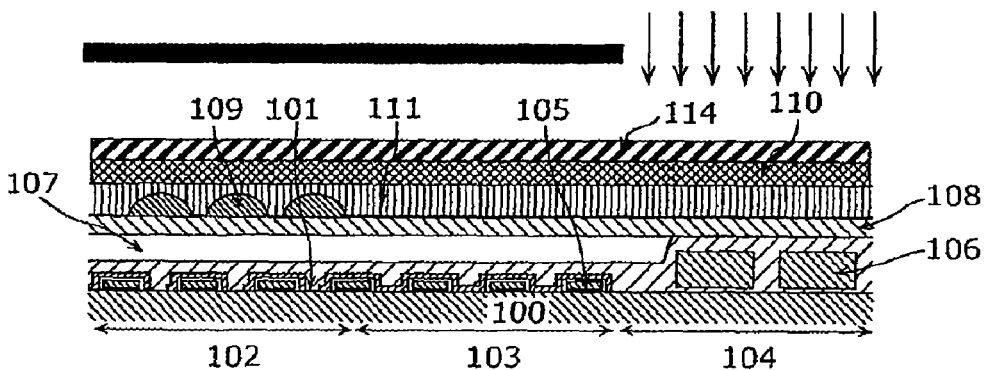
FIG. 14C shows the sixth method for manufacturing the solid-state imaging device according to the second embodiment.
Figure 14D:
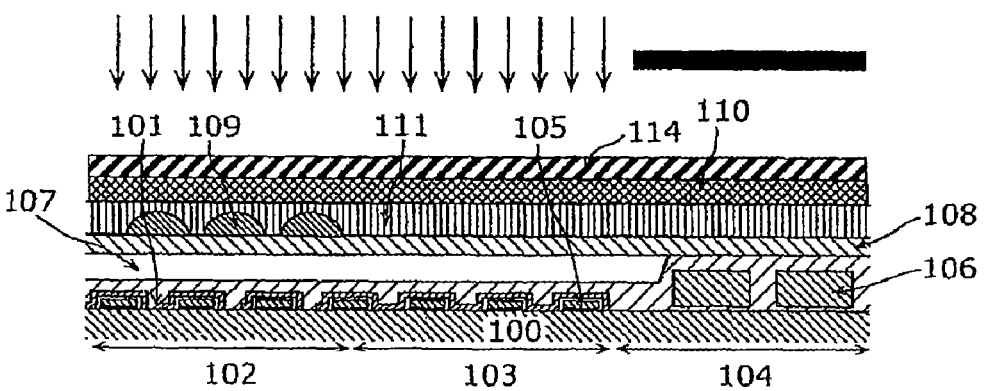
FIG. 14D shows the sixth method for manufacturing the solid-state imaging device according to the second embodiment.
Figure 14E:
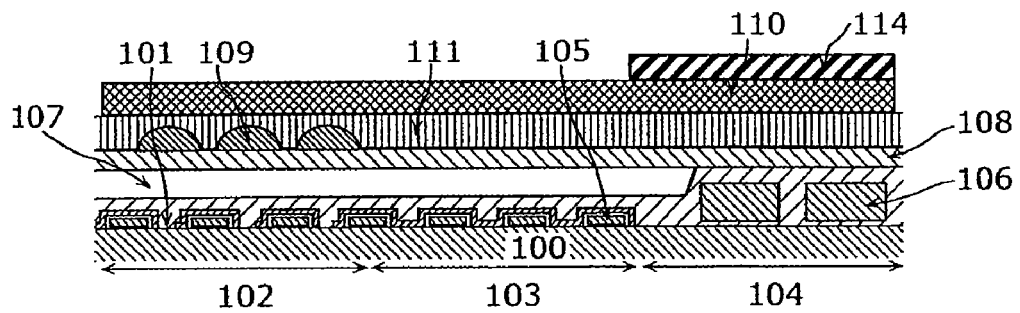
FIG. 14E shows the sixth method for manufacturing the solid-state imaging device according to the second embodiment.
Figure 14F:
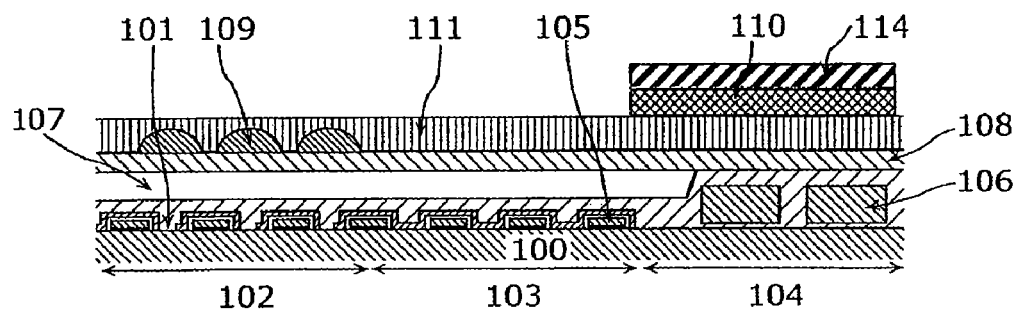
FIG. 14F shows the sixth method for manufacturing the solid-state imaging device according to the second embodiment.
Figure 14G:
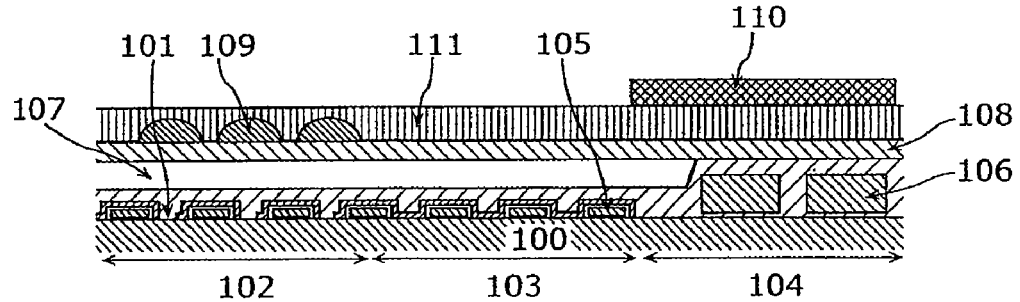
FIG. 14G shows the sixth method for manufacturing the solid-state imaging device according to the second embodiment.
Figure 14H:
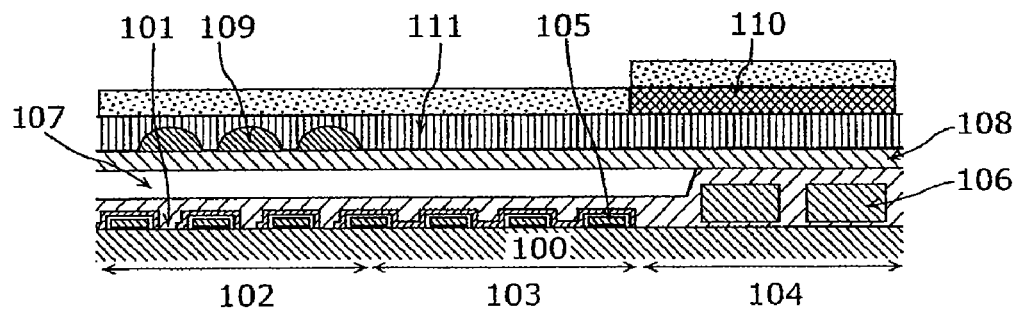
FIG. 14H shows the sixth method for manufacturing the solid-state imaging device according to the second embodiment.
Figure 14I:
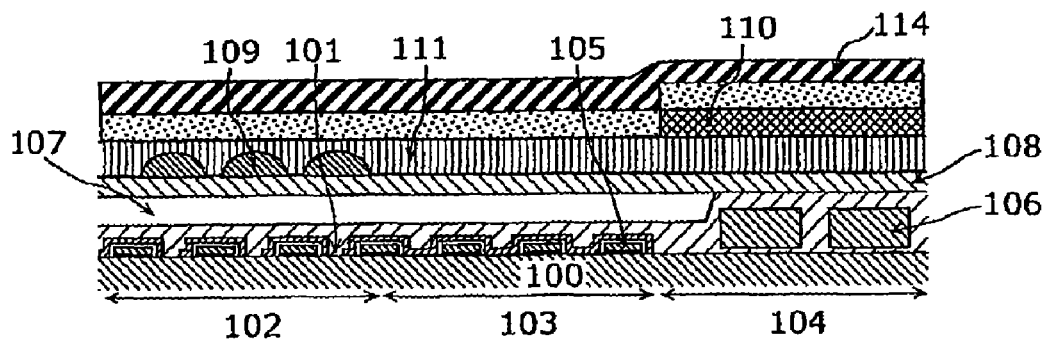
FIG. 14I shows the sixth method for manufacturing the solid-state imaging device according to the second embodiment.
Figure 14J:
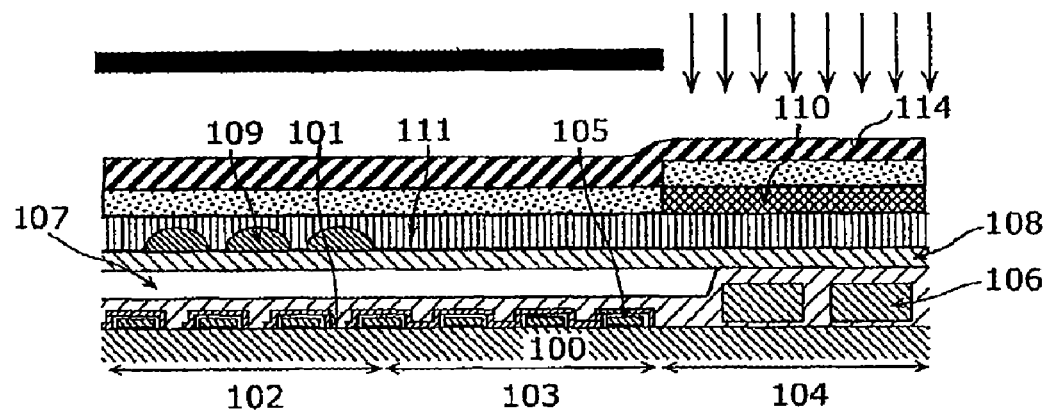
FIG. 14J shows the sixth method for manufacturing the solid-state imaging device according to the second embodiment.
Figure 14K:
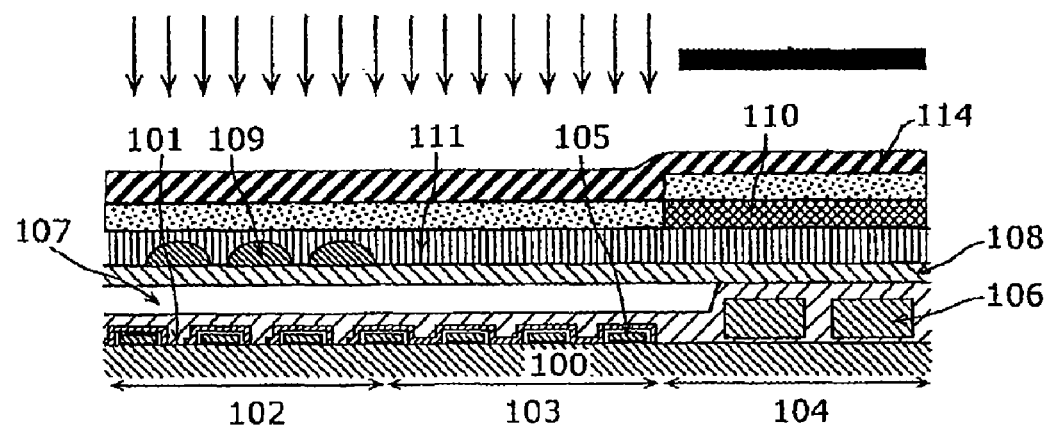
FIG. 14K shows the sixth method for manufacturing the solid-state imaging device according to the second embodiment.
Figure 14L:
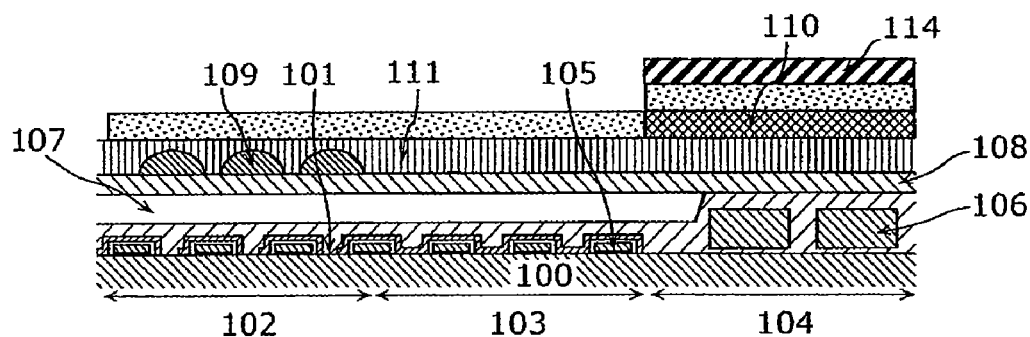
FIG. 14L shows the sixth method for manufacturing the solid-state imaging device according to the second embodiment.
Figure 14M:
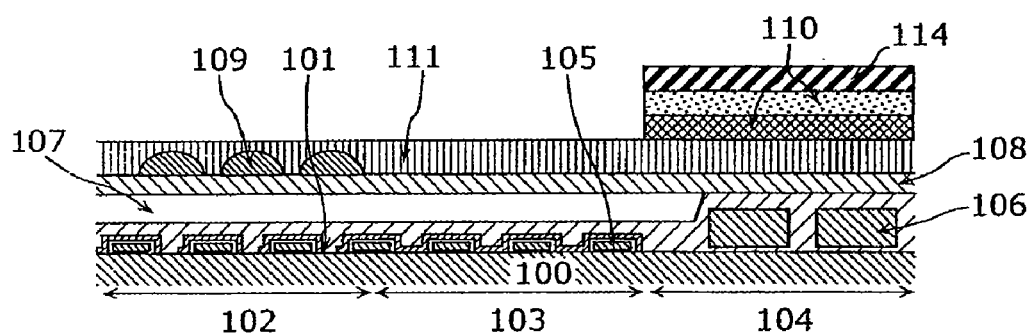
FIG. 14M shows the sixth method for manufacturing the solid-state imaging device according to the second embodiment.
Figure 14N:
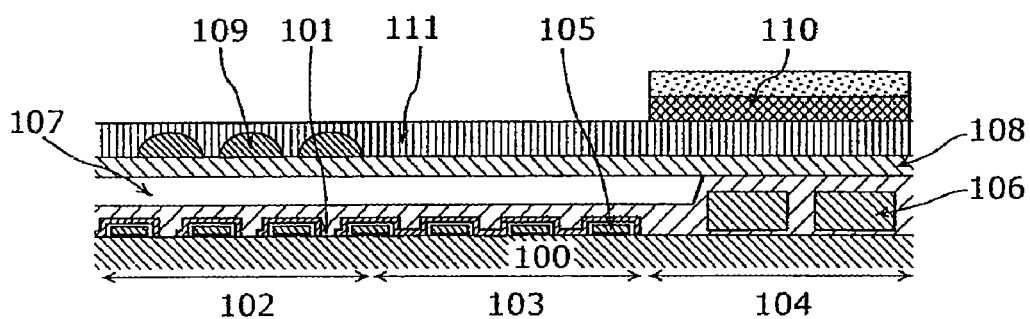
FIG. 14N shows the sixth method for manufacturing the solid-state imaging device according to the second embodiment.

FIGS. 14A to 14N show the sixth method for manufacturing the solid-state imaging device according to the second embodiment. In the sixth method for manufacturing, a two-layer antireflection film is formed by the deposition and the lift-off method.

Compared with the first method for manufacturing according to the second embodiment, the sixth method for manufacturing differs in that processes of FIGS. 14A to 14N, instead of FIGS. 9E to 9J, are included. Description of the same points is omitted, and the following description mainly focuses on different points.

After the transparent film 111 in FIG. 9D is formed, a deposited antireflection film is pattern-formed by the dry etching method. That is to say, as shown in FIGS. 14A to 14G, the first layer antireflection film is formed in the same manner as shown in FIGS. 12A to 12G, and the second layer antireflection film is formed in the same manner as the first layer (see FIGS. 14H to 14N). Furthermore, the two-layer antireflection film is formed by two-layer continuous deposition, and there is a method for pattering by dry etching and the lift-off method.

As described above, in the solid-state imaging device and with the method for manufacturing the solid-state imaging device according to the second embodiment of the present invention, the transparent film 111 having the refractive index lower than that of the microlenses is formed following the formation of the microlenses 109, and then a) the resist for forming the antireflection film 110 is applied, exposed, and developed (in the case of dyeing, dyed); b) the antireflection film 110 is deposited and developed by lift-off after the resist (P-SiN) 114 for patterning the antireflection film 110 to be deposited is applied, exposed, and developed; or c) the antireflection film 110 is formed by the deposition of the antireflection film 110 and the application, exposure, and development of and dry etching with the resist for patterning. Subsequently, the transparent film 111 having the refractive index lower than that of the microlenses 109 is formed. Accordingly, as it becomes unnecessary to form the antireflection film 110 under the microlenses 109, the design freedom for the film thickness of the transparent film (intermediate film) 108 under the microlenses 109 can be broadened. This allows the solid-state imaging device according to the second embodiment of the present invention to improve the sensitivity and smear property.

In addition, in the solid-state imaging device and with the method for manufacturing the solid-state imaging device according to the second embodiment of the present invention, when the to antireflection film 110 is patterned, the microlenses are not etched. Thus, it is possible to use a dry etching process with superior processing accuracy.

In other words, in the solid-state imaging device and with the method for manufacturing the solid-state imaging device according to the second embodiment of the present invention, the antireflection film 110 is arranged in the same layer as the microlenses 109 in the peripheral region 104 excluding the effective pixel region 102 and the OB region 103 or the antireflection film 110 is arranged and formed in the peripheral region 104 excluding the effective pixel region 102 and the OB region 103 after the transparent film 111 having the refractive index lower than that of the microlenses 109 is formed in a layer above the microlenses 109. Accordingly, even when the solid-state imaging device and the effective pixel region are miniaturized, it is possible to obtain a superior sensitivity property, smear property, and flare property.

Figure 15B:
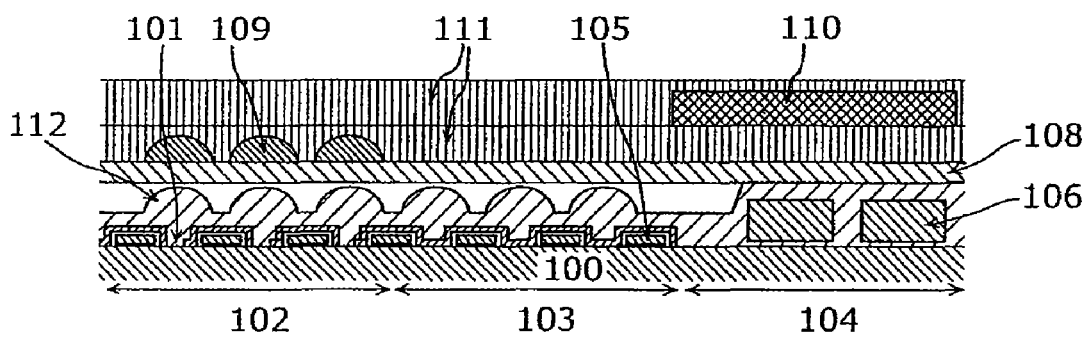
FIG. 15B shows an example of a cross-sectional structure of a CCD image sensor having an inner-layer lens according to the second embodiment.
Figure 16D:
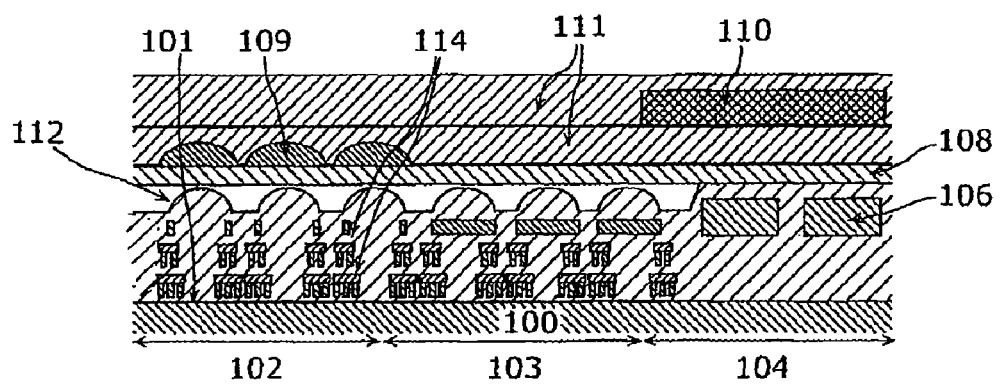
FIG. 16D shows an example of a cross-sectional structure of a MOS image sensor having an inner-layer lens according to the second embodiment.

It is to be noted that the solid-state imaging device according to the second embodiment of the present invention can be used for a CCD image sensor including the intralayer lenses 112 as shown in FIG. 15B, and for a MOS image sensor as shown in FIG. 16D.

It is also to be noted that the solid-state imaging device according to each embodiment is included in a digital camera and the like. The digital camera has an optical system including a lens the like for focusing light scattered from an object onto an imaging area of the solid-state image sensor, a control unit for controlling a drive of the solid-state image sensor, and an image processing unit for performing various processes on an output signal of the solid-state image sensor.

INDUSTRIAL APPLICABILITY

The present invention is useful as the solid-state imaging device having an advantage that, even the miniaturization is advanced, the sensitivity and smear can be optimized while maintaining the flare property by forming the antireflection film in the same layer as the microlenses or the transparent film having the refractive index lower than that of the microlenses on top of the microlens layer and by arranging the former or latter film in the peripheral region outside the effective pixel region; applicable to a CCD sensor, a MOS sensor, and the like in the solid-state imaging device; and further suitable for digital still cameras including the solid-state imaging device, digital movie cameras, and mobile phones with camera.

What is claimed is:

1. A method for manufacturing a solid-state imaging device, said method comprising:
    forming light receiving units on a semiconductor substrate;
    forming microlenses above the light receiving units; and
    forming an antireflection film above the semiconductor substrate, except above the light receiving units, so as to reduce light reflection,
    wherein, in said forming of the antireflection film, the antireflection film is formed at a position equal to or higher than a position of the microlenses.

2. The method for manufacturing the solid-state imaging device according to claim 1,
    wherein, in said forming of the antireflection film, the antireflection film is formed by at least one of a lithography process, a dry etching process, and a process including deposition and lift-off.

3. The method for manufacturing the solid-state imaging device according to claim 1,
    wherein, in said forming of the antireflection film, the antireflection film is formed in a same layer as a layer of the microlenses.

4. The method for manufacturing the solid-state imaging device according to claim 1,
    wherein, in said forming of the antireflection film, the antireflection film is formed in a layer higher than a layer of the microlenses.

5. The method for manufacturing the solid-state imaging device according to claim 1,
    wherein, in said forming of the antireflection film, the antireflection film is an antireflection filter.

6. The method for manufacturing the solid-state imaging device according to claim 1,
    wherein, in said forming of the antireflection film, the antireflection film is a light absorption filter.

7. The method for manufacturing the solid-state imaging device according to claim 1,
    wherein, in said forming of the antireflection film, the antireflection film is a black-color filter.

* * * * *